(12) United States Patent
Zidan et al.

(10) Patent No.: US 12,242,380 B2
(45) Date of Patent: Mar. 4, 2025

(54) MEMORY PROCESSING UNIT ARCHITECTURES AND CONFIGURATIONS

(71) Applicant: MemryX Incorporated, Ann Arbor, MI (US)

(72) Inventors: Mohammed Zidan, Ann Arbor, MI (US); Jacob Botimer, Ann Arbor, MI (US); Timothy Wesley, Ann Arbor, MI (US); Chester Liu, Ann Arbor, MI (US); Zhengya Zhang, Ann Arbor, MI (US); Wei Lu, Ann Arbor, MI (US)

(73) Assignee: MemryX Incorporated, Ann Arbor, MI (US)

( * ) Notice: Subject to any disclaimer, the term of this patent is extended or adjusted under 35 U.S.C. 154(b) by 61 days.

(21) Appl. No.: 17/943,100

(22) Filed: Sep. 12, 2022

(65) Prior Publication Data

US 2023/0075069 A1 Mar. 9, 2023

Related U.S. Application Data

(63) Continuation of application No. PCT/US2021/048498, filed on Aug. 31, 2021.

(51) Int. Cl.
| | |
|---|---|
| *G06F 3/06* | (2006.01) |
| *G06F 9/46* | (2006.01) |
| *G06F 12/02* | (2006.01) |
| *G06F 12/06* | (2006.01) |
| *G06N 3/045* | (2023.01) |
| *G06N 3/063* | (2023.01) |
| *G11C 11/54* | (2006.01) |

(52) U.S. Cl.
CPC ........ *G06F 12/0607* (2013.01); *G06F 3/0611* (2013.01); *G06F 3/0659* (2013.01); *G06F 3/0673* (2013.01); *G06F 9/46* (2013.01); *G06F 12/0238* (2013.01); *G06N 3/045* (2023.01); *G06N 3/063* (2013.01); *G11C 11/54* (2013.01)

(58) Field of Classification Search
CPC .. G06F 12/0238; G06F 12/0607; G06F 17/16; G06F 3/0611; G06F 3/0659; G06F 3/0673; G06F 9/46
See application file for complete search history.

(56) References Cited

U.S. PATENT DOCUMENTS

2019/0041952 A1\* 2/2019 Alameldeen ............ G06F 1/329

\* cited by examiner

*Primary Examiner* — Yong J Choe

(57) ABSTRACT

A memory processing unit (MPU) can include a first memory, a second memory, a plurality of processing regions and control logic. The first memory can include a plurality of regions. The plurality of processing regions can be interleaved between the plurality of regions of the first memory. The processing regions can include a plurality of compute cores. The second memory can be coupled to the plurality of processing regions. The control logic can configure data flow between compute cores of one or more of the processing regions and corresponding adjacent regions of the first memory. The control logic can also configure data flow between the second memory and the compute cores of one or more of the processing regions. The control logic can also configure data flow between compute cores within one or more respective ones of the processing regions.

20 Claims, 27 Drawing Sheets

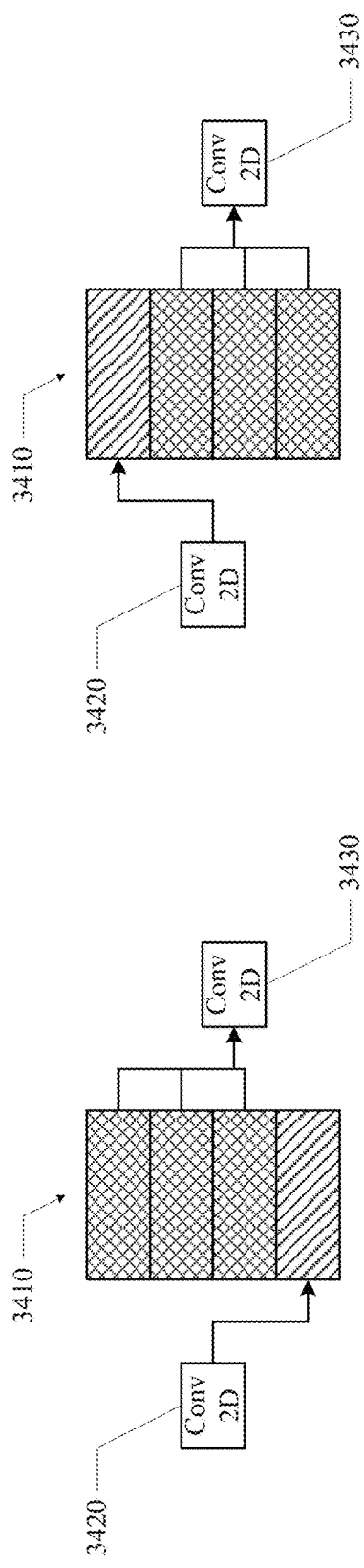
FIG. 34A
FIG. 34B
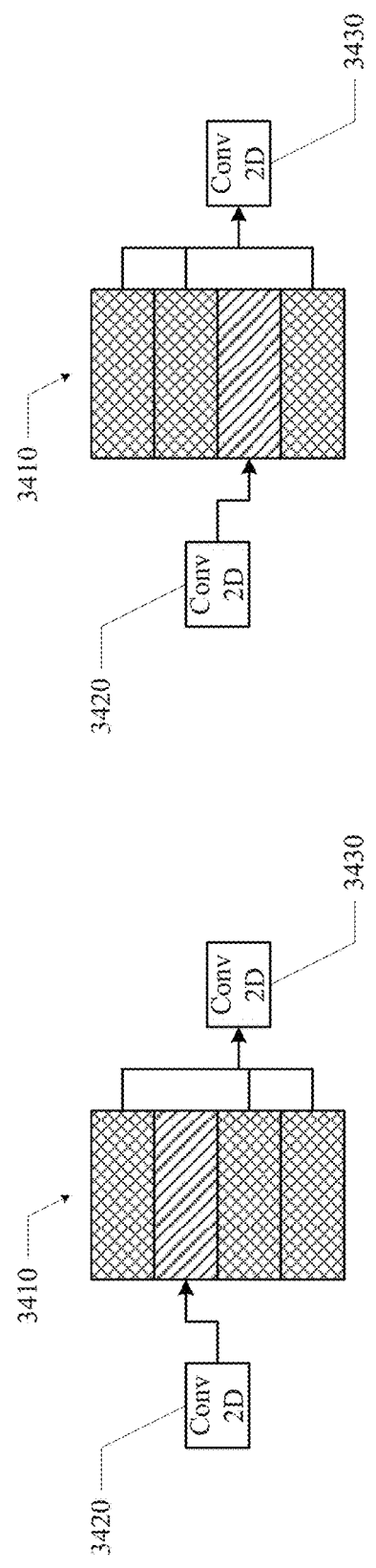
FIG. 34C
FIG. 34D

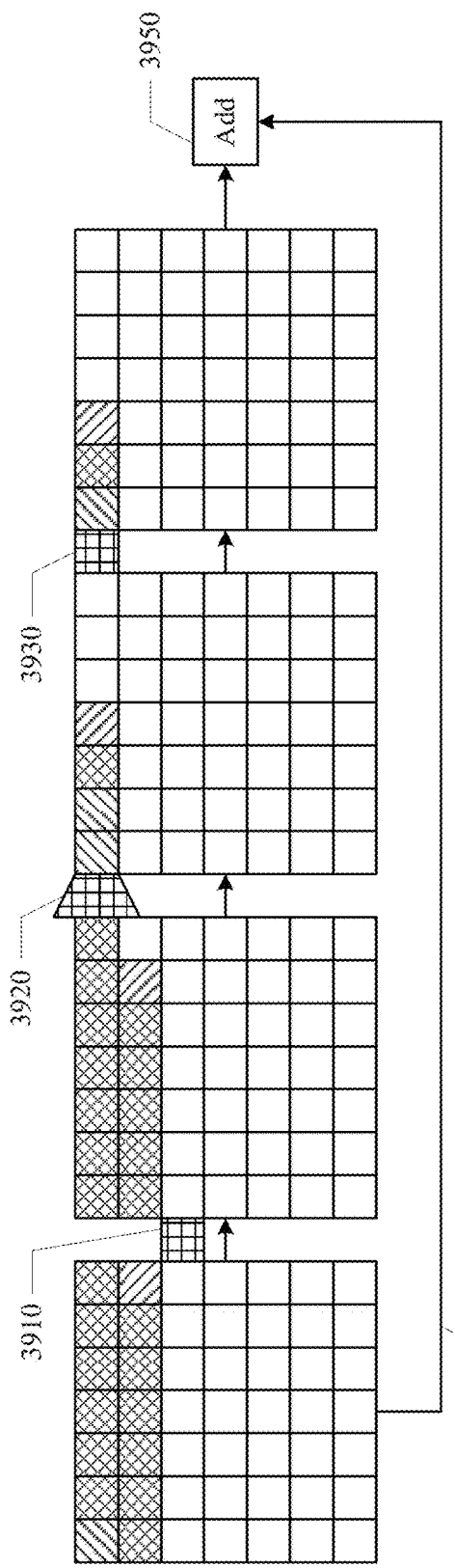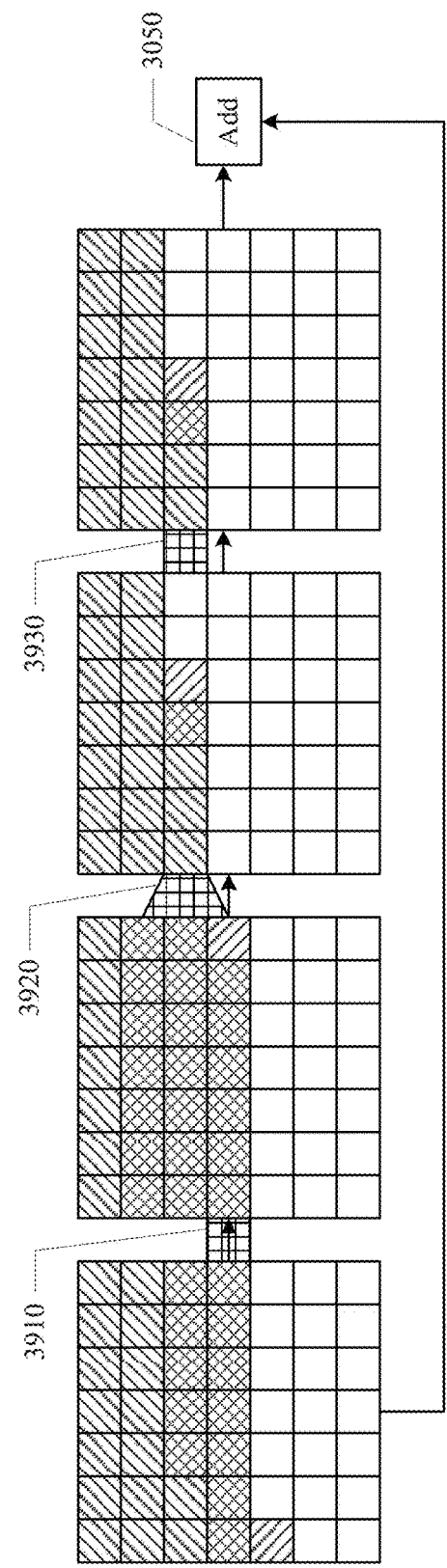
FIG. 39A
FIG. 39B

MEMORY PROCESSING UNIT ARCHITECTURES AND CONFIGURATIONS

CROSS-REFERENCE TO RELATED APPLICATIONS

This application is a continuation of PCT Patent Application No. PCT/US2021/048498 filed Aug. 31, 2021, and claims the benefit of U.S. Provisional Patent Application No. 63/072,904 filed Aug. 31, 2020, which are incorporated herein in their entirety.

BACKGROUND OF THE INVENTION

Computing systems have made significant contributions toward the advancement of modern society and are utilized in a number of applications to achieve advantageous results. Applications such as artificial intelligence, machine learning, big data analytics and the like perform computations on large amounts of data. In conventional computing systems, data is transferred from memory to one or more processing units, the processing units perform calculations on the data, and the results are then transferred back to memory. The transfer of large amounts of data from memory to the processing unit and back to memory takes time and consumes power. Accordingly, there is a continuing need for improved computing systems that reduce processing latency, data latency and or power consumption.

SUMMARY OF THE INVENTION

The present technology may best be understood by referring to the following description and accompanying drawings that are used to illustrate embodiments of the present technology directed toward memory processing architectures.

In one embodiment, a memory processing unit (MPU) can include a first memory, a second memory, and a plurality of processing regions. The plurality of processing regions can be interleaved between a plurality of regions of the first memory. The second memory can be coupled to the plurality of processing regions. The processing regions can include a plurality of compute cores configurable in one or more clusters. The plurality of compute cores of respective ones of the plurality of processing regions can be coupled between adjacent ones of the plurality of regions of the first memory. The plurality of compute cores of respective ones of the plurality of processing regions can be configurably couplable in series.

In another embodiment, a memory processing method can include configuring data flow between compute cores of one or more of a plurality of processing regions and corresponding adjacent ones of a plurality of regions of a first memory. Data flow between a second memory and the compute cores of the one or more of the plurality of processing regions can also be configured. Data flow between compute cores within respective ones of the one or more of the plurality of processing regions can also be configured. One or more sets of compute cores of one or more of the plurality of processing regions to perform respective compute functions of a neural network model can also be configured. Thereafter, weights for the neural network model can be loaded into the second memory. Activation data for the neural network model can also be into one or more of the plurality of regions of the first memory. Data movement between one or more compute cores producing given data and one or more other compute cores consuming the given data can be synchronized based on the neural network model.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which:

FIGS. 34A-34D illustrate an exemplary shared partial buffer for a 3×3 kernel size, in accordance with aspects of the present technology.

FIGS. 39A and 39B illustrate pixel synchronization in a shared buffer, in accordance with aspects of the present technology.

DETAILED DESCRIPTION OF THE INVENTION

Figure 1:
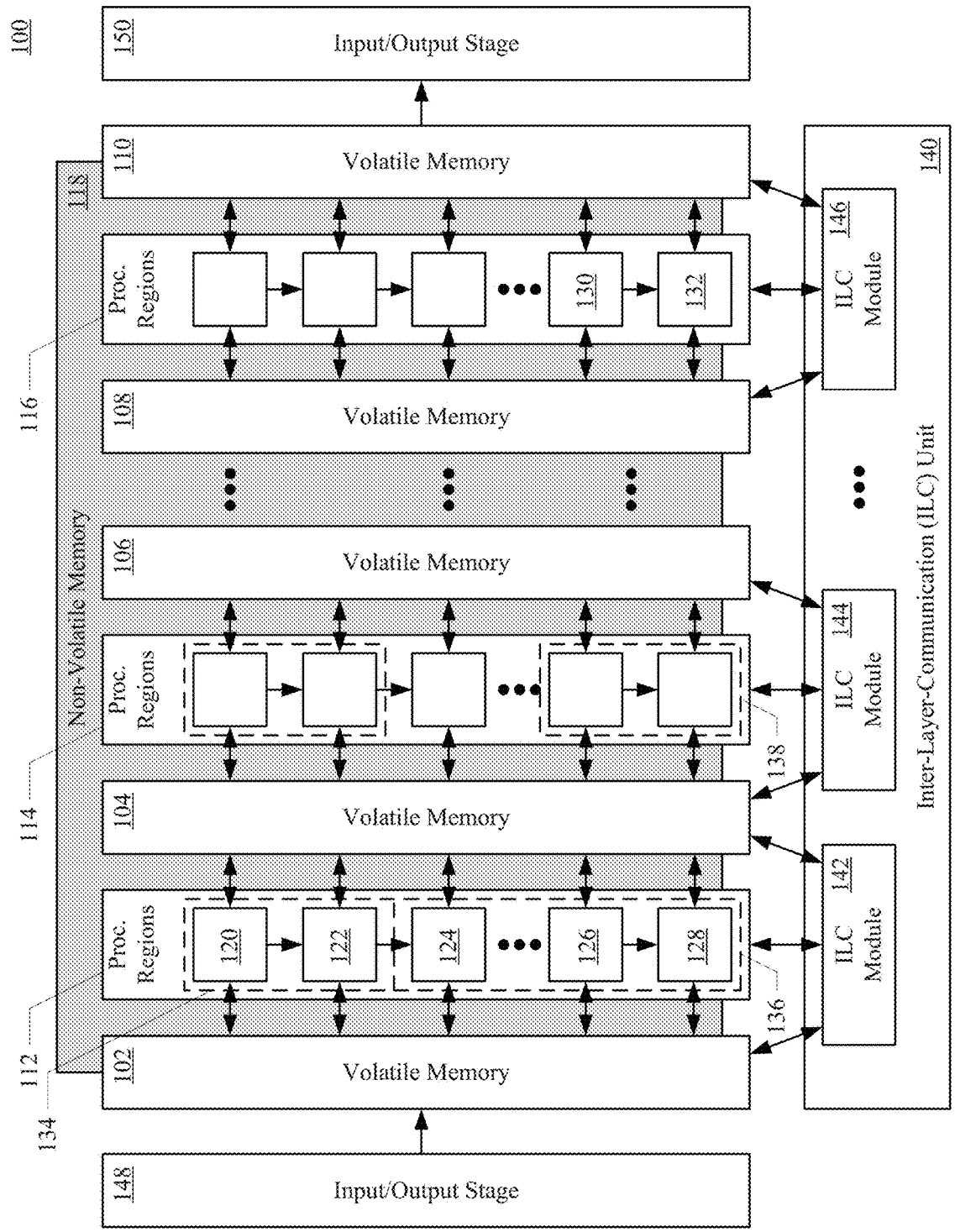
FIG. 1 shows a memory processing unit (MPU), in accordance with aspects of the present technology.

Reference will now be made in detail to the embodiments of the present technology, examples of which are illustrated in the accompanying drawings. While the present technology will be described in conjunction with these embodiments, it will be understood that they are not intended to limit the technology to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. The use of the terms "comprises," "comprising," "includes," "including" and the like specify the presence of stated elements, but do not preclude the presence or addition of one or more other elements and or groups thereof. It is also to be understood that although the terms first, second, etc. may be used herein to describe various elements, such elements should not be limited by these terms. These terms are used herein to distinguish one element from another. For example, a first element could be termed a second element, and similarly a second element could be termed a first element, without departing from the scope of embodiments. It is also to be understood that when an element is referred to as being "coupled" to another element, it may be directly or indirectly connected to the other element, or an intervening element may be present. In contrast, when an element is referred to as being "directly connected" to another element, there are not intervening elements present. It is also to be understood that the term "and or" includes any and all combinations of one or more of the associated elements. It is also to be understood that the phraseology and terminology used herein is for the purpose of description and should not be regarded as limiting.

Referring to FIG. 1, a memory processing unit (MPU), in accordance with aspects of the present technology, is shown. The memory processing unit 100 can include a first memory including a plurality of regions 102-110, a plurality of processing regions 112-116 and a second memory 118. The second memory 118 can be coupled to the plurality of processing regions 112-116. The second memory 118 can optionally be logically or physically organized into a plurality of regions. The plurality of regions of the second memory 118 can be associated with corresponding ones of the plurality of processing region 112-116. In addition, the plurality of regions of the second memory 118 can include a plurality of blocks organized in one or more macros. The first memory 102-110 can be volatile memory, such as static random-access memory (SRAM) or the like. The second memory can be non-volatile memory, such as resistive random-access memory (RRAM), magnetic random-access memory (MRAM), flash memory (FLASH) or the like. The second memory can alternatively be volatile memory. In one implementation, the first memory 102-110 can be data memory, feature memory or the like, and the second memory 118 can be weight memory. Generally, the second memory can be high density, local and wide read memory.

The plurality of processing regions 112-116 can be interleaved between the plurality of regions of the first memory 102-110. The processing regions 112-116 can include a plurality of compute cores 120-132. The plurality of compute cores 120-132 of respective ones of the plurality of processing regions 112-116 can be coupled between adjacent ones of the plurality of regions of the first memory 102-110. For example, the compute cores 120-128 of a first processing region 112 can be coupled between a first region 102 and a second region 104 of the first memory 102-110. The compute cores 120-132 in each respective processing region 112-116 can be configurable in one or more clusters 134-138. For example, a first set of compute cores 120, 122 in a first processing region 112 can be configurable in a first cluster 134. Similarly, a second set of compute cores 124-128 in the first processing region can be configurable in a second cluster 136. The plurality of compute cores 120-132 of respective ones of the plurality of processing regions 112-116 can also be configurably couplable in series. For example, a set of compute cores 120-124 in a first processing region 112 can be communicatively coupled in series, with a second compute core 122 receiving data and or instructions from a first compute core 120, and a third compute core 124 receiving data and or instructions from the second compute core 122.

The memory processing unit 100 can further include an inter-layer-communication (ILC) unit 140. The ILC unit 140 can be global or distributed across the plurality of processing regions 112-116. In one implementation, the ILC unit 140 can include a plurality of ILC modules 142-148, wherein each ILC module can be coupled to a respective processing regions 112-116. Each ILC module can also be coupled to the respective regions of the first memory 102-110 adjacent the corresponding respective processing regions 112-116. The inter-layer-communication unit 140 can be configured to synchronize data movement between one or more compute cores producing given data and one or more other compute cores consuming the given data.

The memory processing unit 100 can further include one or more input/output stages 142, 144. The one or more input/output stages 142, 144 can be coupled to one or more respective regions of the first memory 102-110. The one or more input/output stages 142, 144 can include one or more input ports, one or more output ports, and or one or more input/output ports. The one or more input/output stages 142, 144 can be configured to stream data into or out of the memory processing unit 100. For example, one or more of the input/output (I/O) cores can be configured to stream data into a first one of the plurality of regions of the first memory 102-110. Similarly, one or more input/output (I/O) cores can be configured to stream data out of a last one of the plurality of regions of the first memory 102-110.

The plurality of processing regions 112-116 can be configurable for memory-to-core dataflow from respective ones of the plurality of regions of the first memory 102-110 to one or more cores 120-132 within adjacent ones of the plurality of processing regions 112-116. The plurality of processing regions 112-116 can also be configurable for core-to-memory dataflow from one or more cores 120-132 within ones of the plurality of processing regions 112-116 to adjacent ones of the plurality of regions of the first memory 102-110. In one implementation, the dataflow can be configured for a given direction from given ones of the plurality of regions of the first memory 102-110 through respective ones of the plurality of processing regions to adjacent ones of the plurality of regions of the first memory 102-110. For example, The plurality of processing regions 112-116 can also be configurable for memory-to-core data flow from the second memory 118 to one or more cores 120-132 of corresponding ones of the plurality of processing regions 112-116. If the second memory 118 is logically or physically organized in a plurality of regions, respective ones of the plurality of regions of the second memory 118 can be configurably couplable to one or more compute cores in respective ones of the plurality of processing regions 112-116.

The plurality of processing regions 112-116 can be further configurable for core-to-core data flow between select adjacent compute cores 120-132 in respective ones of the plurality of processing regions 112-116. For example, a given core 124 can be configured to pass data accessed from an adjacent portion of the first memory 102 with one or more other cores 126-128 configurably coupled in series with the given compute core 124. In another example, a given core 120 can be configured to pass data access from the second memory 118 with one or more other cores 122 configurably coupled in series with the given compute core 120. In yet another example, a given compute core 120 can pass a result, such as a partial sum, computed by the given compute core 120 to one or more other cores 122 configurably coupled in series with the given compute core 120.

The plurality of processing regions 112-116 can include one or more near memory (M) cores. The one or more near memory (M) cores can be configurable to compute neural network functions. For example, the one or more near memory (M) cores can be configured to compute vector-vector products, vector-matrix products, matrix-matrix products, and the like, and or partial products thereof.

The plurality of processing regions 112-116 can also include one or more arithmetic (A) cores. The one or more arithmetic (A) cores can be configurable to compute arithmetic operations. For example, the arithmetic (A) cores can be configured to compute merge operation, arithmetic calculation that are not supported by the near memory (M) cores, and or the like.

The plurality of the inputs and output regions 142, 144 can also include one or more input/output (I/O) cores. The one or more input/output (I/O) cores can be configured to access input and or output ports of the memory processing unit (MPU) 100. The term input/output (I/O) core as used herein can refer to cores configured to access input ports, cores configured to access output ports, or cores configured to access both input and output ports.

The compute cores 120-132 can include a plurality of physical channels configurable to perform computations, accesses and the like simultaneously with other cores within respective processing regions 112-116, and or simultaneously with other cores in other processing regions 112-116. The compute cores 120-132 of respective ones of the plurality of processing regions 112-116 can be associated with one or more blocks of the second memory 118. The compute cores 120-132 of respective ones of the plurality of processing regions 112-116 can be associated with respective slices of the second plurality of memory regions. The cores 120-132 can include a plurality of configurable virtual channels.

As further described below, the memory processing unit 100 can advantageously provide simple dataflow without a centralized control unit. The memory processing unit 100 can also advantageously implement immersed in-memory computing. The memory processing unit 100 can also advantageously reduce off-chip data communications. The memory processing unit 100 can also advantageously increase data reuse. The memory processing unit 100 can also be configured utilizing offline programming.

Figure 2:
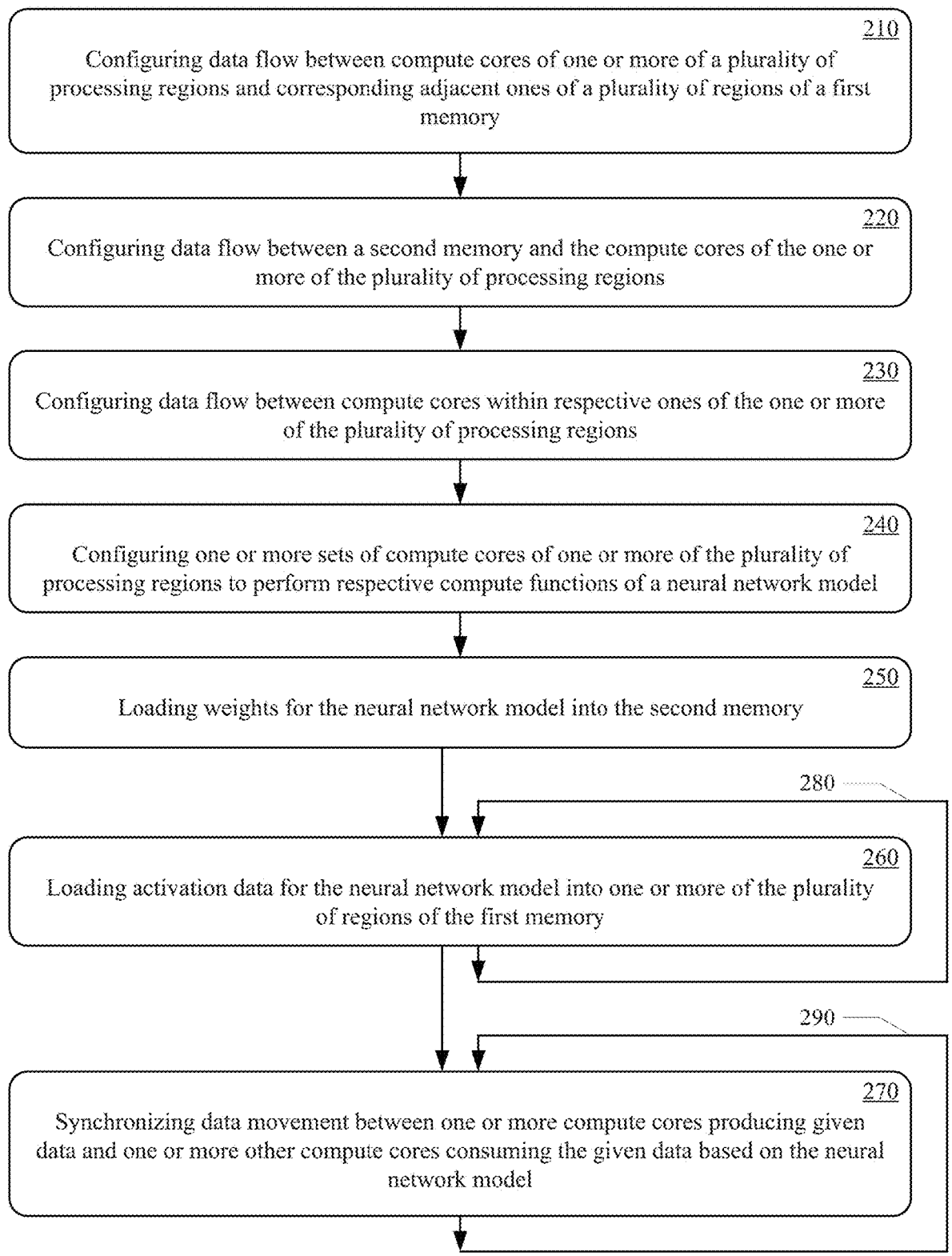
FIG. 2 shows a memory processing method, in accordance with aspects of the present technology.

Referring now to FIG. 2, a memory processing method, in accordance with aspects of the present technology, is shown. The method will be explained with reference to the memory processing unit 100 of FIG. 1. The method can include configuring data flow between compute cores of one or more of a plurality of processing regions 112-116 and corresponding adjacent ones of the plurality of regions of the first memory, at 210. At 220, data flow between the second memory 118 and the compute cores 120-132 of the one or more of the plurality of processing regions 112-116 can be configured. At 230, data flow between compute cores 120-132 within respective ones of the one or more of the plurality of processing regions 112-116 can be configured. Although the processes of 210-240 are illustrated as being performed in series, it is appreciated that the processes can be performed in parallel or in various combinations of parallel and sequential operations.

At 240, one or more sets of compute cores 120-132 of one or more of the plurality of processing regions 112-116 can be configured to perform respective compute functions of a neural network model. At 250, weights for the neural network model can be loaded into the second memory 118. At 260, activation data for the neural network model can be loaded into one or more of the plurality of regions of the first memory 102-110.

At 270, data movement between one or more compute cores producing given data and one or more other compute cores consuming the given data can be synchronized based on the neural network model. The synchronization process can be repeated at 280 for processing the activation data of the neural network model. The synchronization process can include synchronization of the loading of the activation data of the neural network model over a plurality of cycles, at 290.

Figure 3:
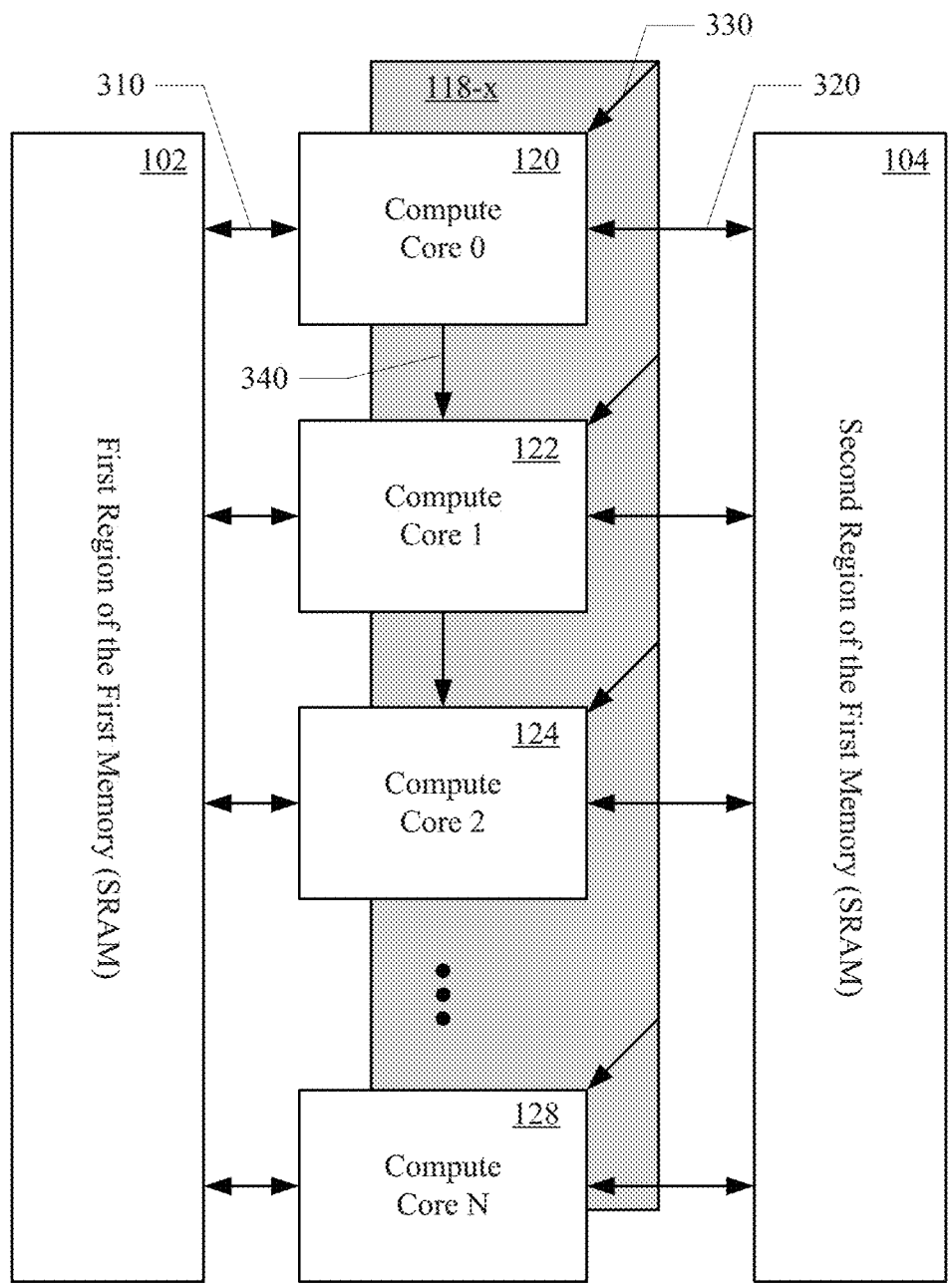
FIG. 3 shows configuration of dataflows in the memory processing unit, in accordance with aspects of the present technology.

Referring now to FIG. 3, configuration of dataflows in the memory processing unit, in accordance with aspects of the present technology, is illustrated. The dataflow 310, 320 between the compute cores 120-128 of the processing regions and adjacent portions of first memory region 102, 104 can be configured in either direction. For example, the compute cores 120-128 and the adjacent portions of the first memory region 102, 104 can be configured for dataflow from a first portion of the first memory region 102, through the compute cores 120-128, and to a second portion of the first memory region 104. Alternatively, the dataflow can be configured from the second portion of the first memory region 104, through the compute cores 120-128, to the first portion of the first memory region 102. In one implementation, the dataflow between the compute cores 120-128 of the processing regions and adjacent portions of first memory region 102, 104 can provide a direct route to access feature map data or the like.

The dataflow 330 from the second memory region 118 to the compute cores of the processing regions can also be configured. In one implementation, the dataflow from the second memory region 118 to the compute cores 120-128 can provide a direct route to access kernel data, weight data or the like. The dataflow 340 between the compute cores 120-128 can also be configured. In one implementation, the dataflow between the compute cores 120-128 can provide for the sharing of data from the second memory region with others of the compute cores 120-128 in a corresponding processing region. In another implementation, the dataflow between the compute cores 120-128 can provide for the sharing of data from an adjacent portion of the first memory region. In yet another implementation, the dataflow between compute cores 120-128 can provide for passing compute result data sequentially to other of the compute cores 120-128 in a corresponding processing region. For example, dataflow between the compute cores 120-128 can be configured to sequentially pass partial sum data to adjacent ones of the compute cores 120-128.

Figure 4A:
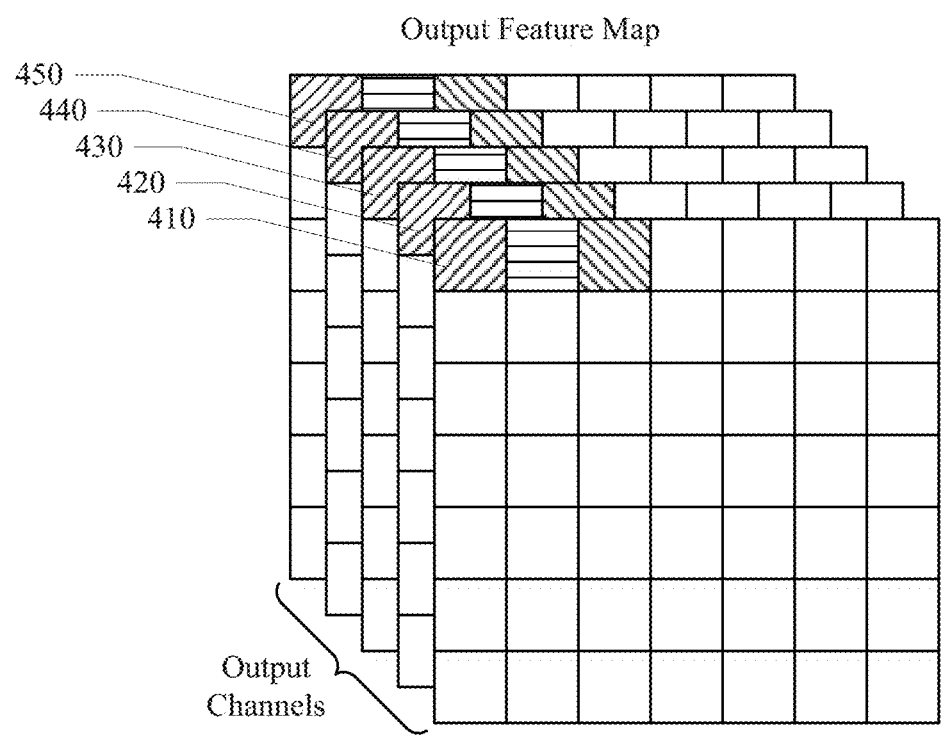
FIGS. 4A-4C show an exemplary computation of multiple output feature map pixels, in accordance with aspects of the present technology.
Figure 4B:
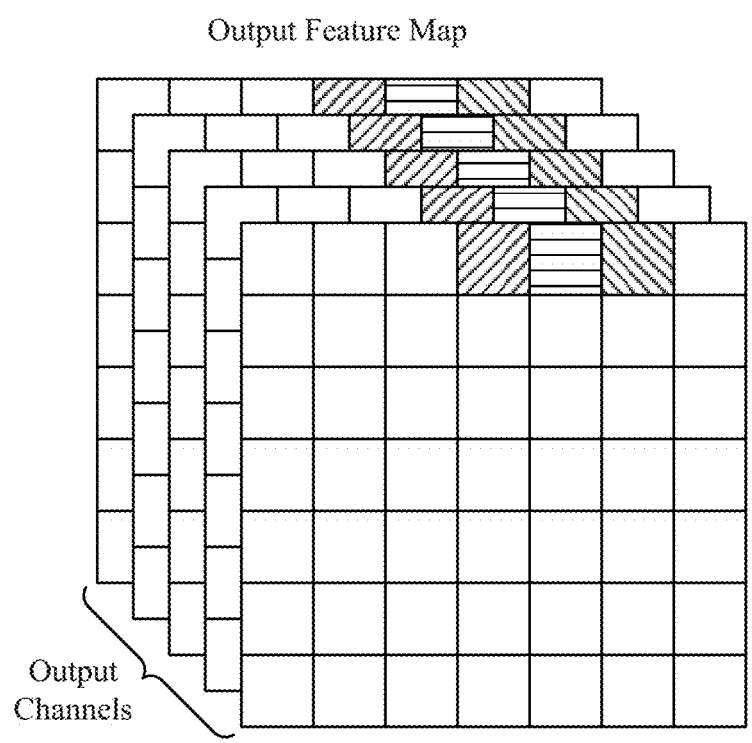
Figure 4C:
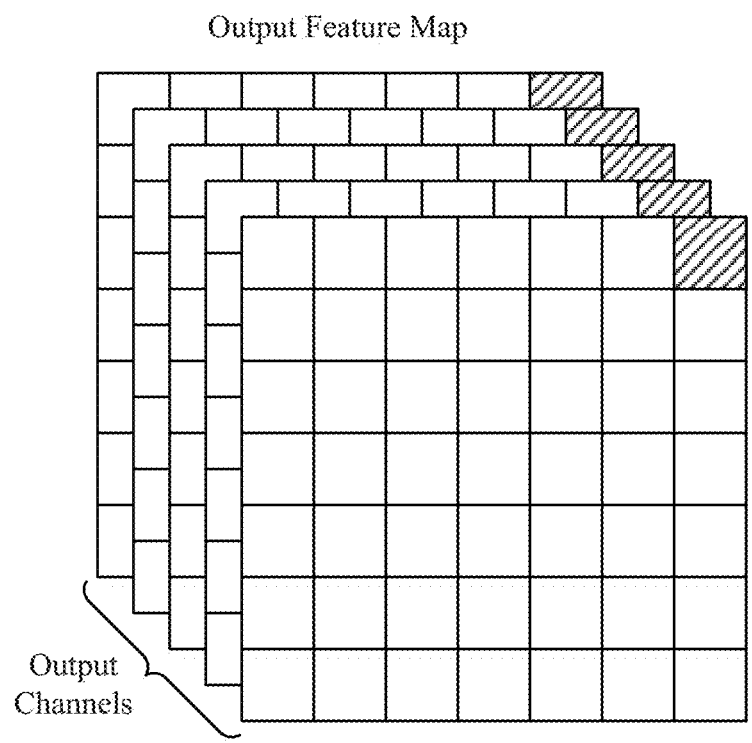

Referring now to FIGS. 4A-4C, an exemplary computation of multiple output feature map pixels, in accordance with aspects of the present technology, is illustrated. One or more compute cores can be configured to compute a corresponding output feature map pixel from an input feature map pixel value and a kernel data (weight) value. As illustrated, compute cores can be configured as three pixel workers to compute output feature map pixel values for each of the output channels. For example, a given pixel worker can compute output feature map pixel values 410-450 for each of the output channels of the output feature map. The pixel workers can then step to the next set of three pixel values to compute the corresponding output channels of the output feature map, as illustrated in FIG. 4B. In a polymorphic implementation, multiple compute cores can work together as pixel workers. The maximum number of pixel workers for a given layer is limited to the output feature map width of the given layer. The kernel, weight data or the like can be reused without reloading them from the second memory region.

Figure 5:
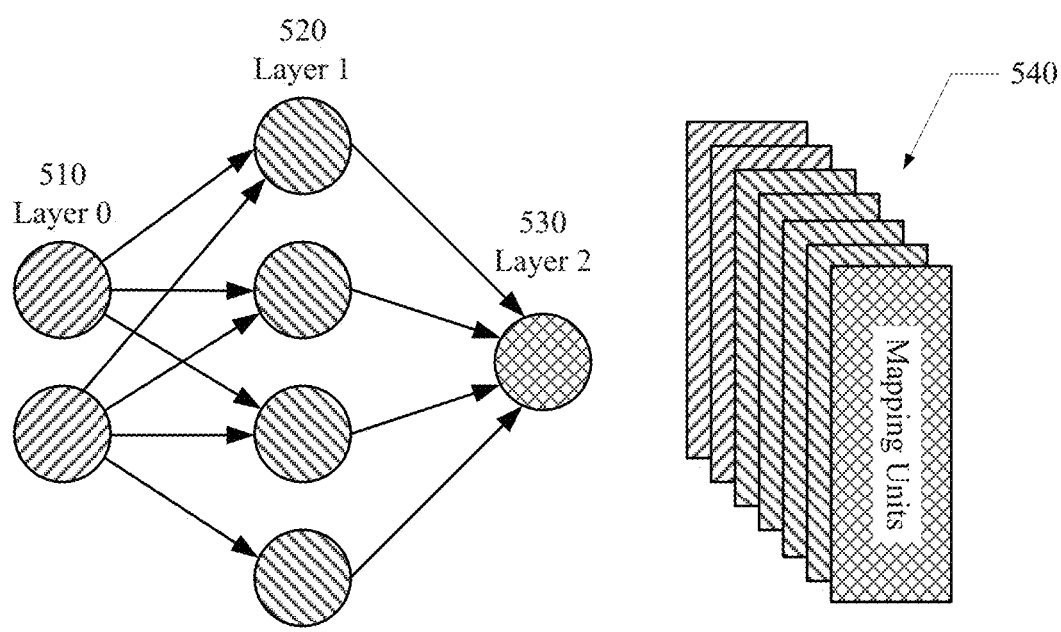
FIG. 5 illustrates an exemplary mapping unit for a neural network, in accordance with aspects of the present technology.
Figure 6:
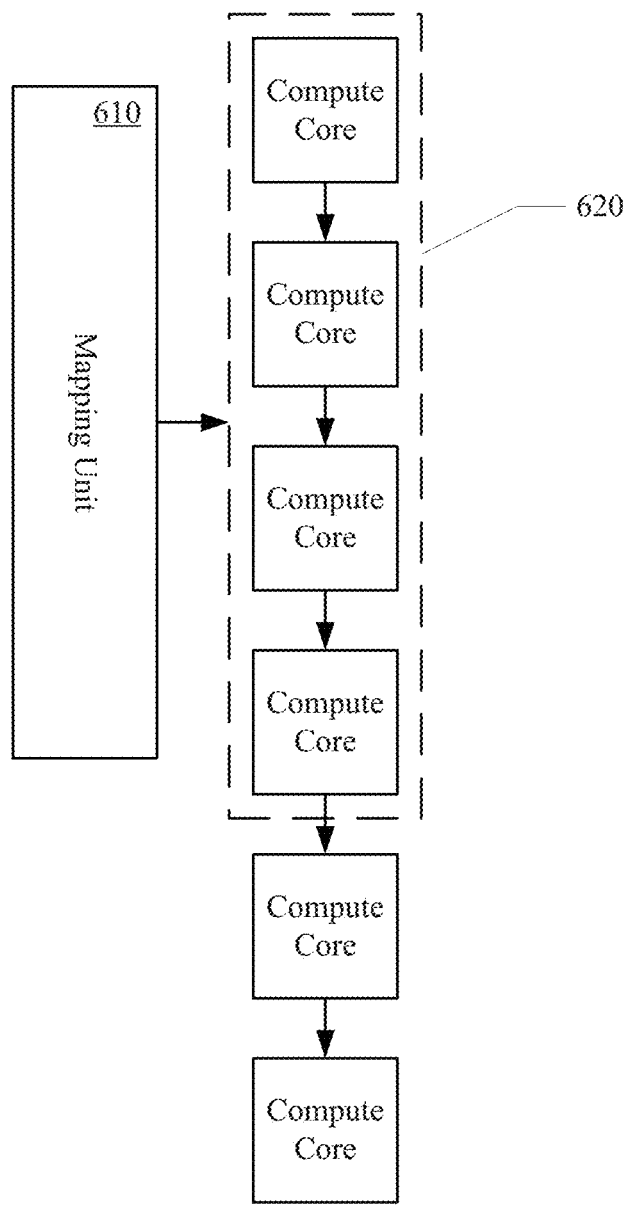
FIG. 6 illustrates an exemplary compute core for a mapping unit, in accordance with aspects of the present technology.

In accordance with aspects of the present technology, a neural network layer, a part of a neural network layer, or a plurality of fused neural network layers can be mapped to a single cluster of compute cores as a mapping unit. A cluster of compute cores are a group of cores of a given processing region that are configured to work together to compute a mapping unit. For example, the nodes of a first layer 510 of a neural network and the nodes of a second layer 520 can be mapped as mapping units to the compute cores, while the node of a third layer 530 can be mapped as a mapping unit to compute cores, as illustrated in FIG. 5. Furthermore, a mapping unit 610 can be computed by a compute core cluster 620 as illustrated in FIG. 6. Optionally, more compute core than are needed to compute a mapping unit can be configured in a compute cluster to improve computing performance.

Figure 7:
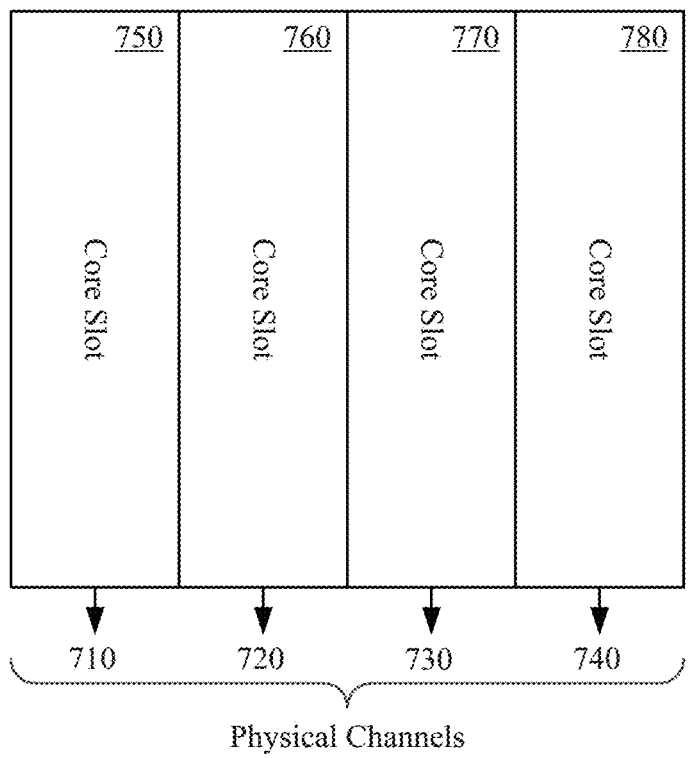
FIG. 7 illustrates exemplary memory core slots, in accordance with aspects of the present technology.
Figure 8:
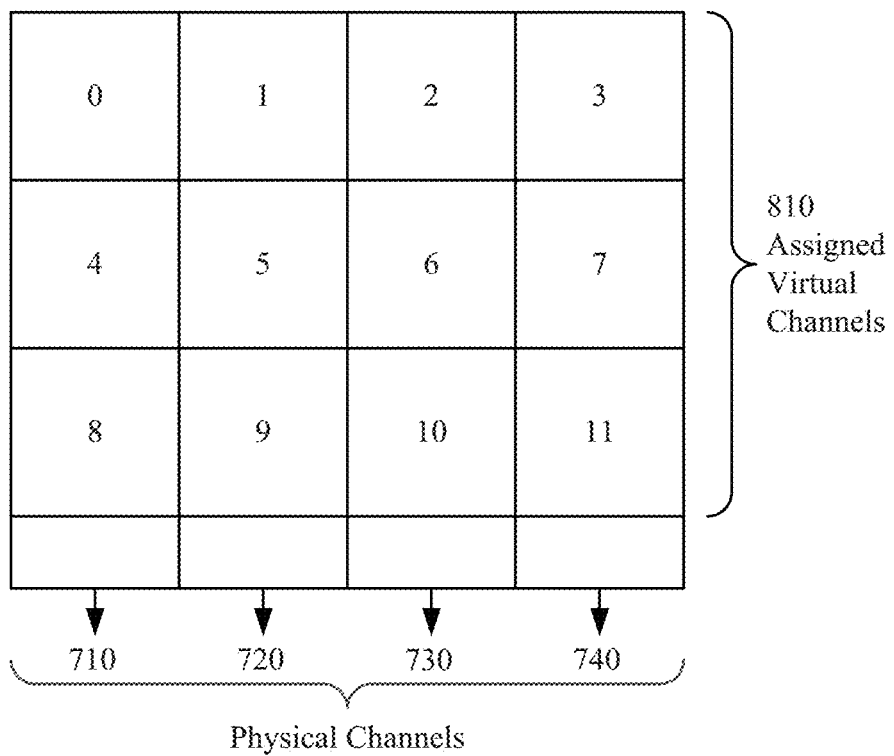
FIG. 8 illustrates exemplary virtual channels of a memory, in accordance with aspects of the present technology.

As illustrated in FIG. 7, the compute cores 120-128 can compute a plurality of physical channels 710-740 simultaneously. In addition, the physical channels 710-740 of the compute cores can be associated with respective shares of the second memory region 118, which are referred to herein as core slots 750-780. The compute cores 120-128 can also be configured to compute a plurality of virtual channels 810, as illustrated in FIG. 8. The virtual channels 810 also be associate with respective shares of the second memory region 118. In one implementation, the number of virtual channels 810 of a compute core 120-128 can be greater than the number of physical channel 710-740.

Again, second memory 118 can be logically or physically organized into a plurality of regions. In one implementation, the second memory region 118 can be organized into a plurality of processing region macros, wherein each processing region 112-116 can be associated with one or more processing region macros of the second memory region 118. In addition, processing region macros can be organized into core slots, wherein each physical channel of a compute core is associated with a core slot. The share of the second memory region can be flexibly assigned during a programming phase, rather than being a static fixed amount. In addition, the compute cores 120-128 in respective processing regions 112-116 can be configured in one or more clusters. The clustering of compute cores can be utilized to increase computing by using multiple compute cores. Each compute core can be configured to compute a whole or a part of a compute operation. The compute workload can be distributed over the compute cores of a given cluster based on the output channels of the compute cores, the data in the first memory 102-110, or a combination thereof. For the output channels, the workload can be distributed for whole or partial channels. Each distribution has its own properties. For instance, one configuration can be used to reduce access to the second memory 118, while the other can facilitate the mapping of a layer of a neural network model over multiple macros of the second memory 118. A group of compute cores can be configured for a given cluster shape and type.

Figure 10:
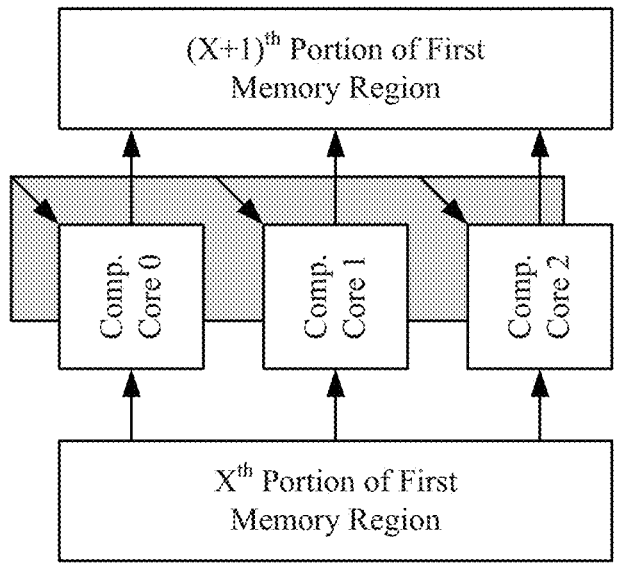
FIGS. 9-12 illustrate a whole channel compute core configuration, in accordance with aspects of the present technology.
Figure 9:
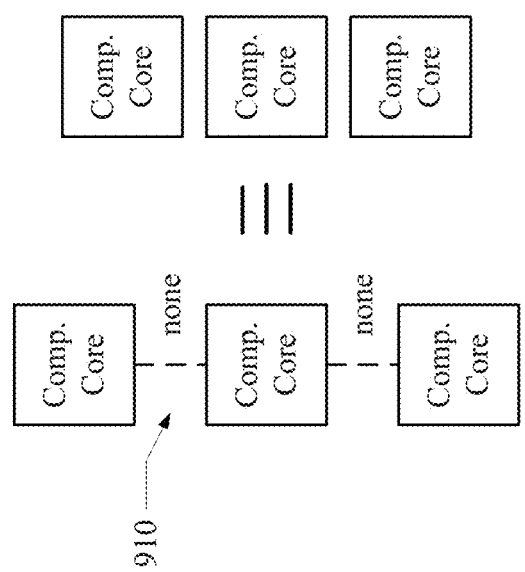
Figure 11:
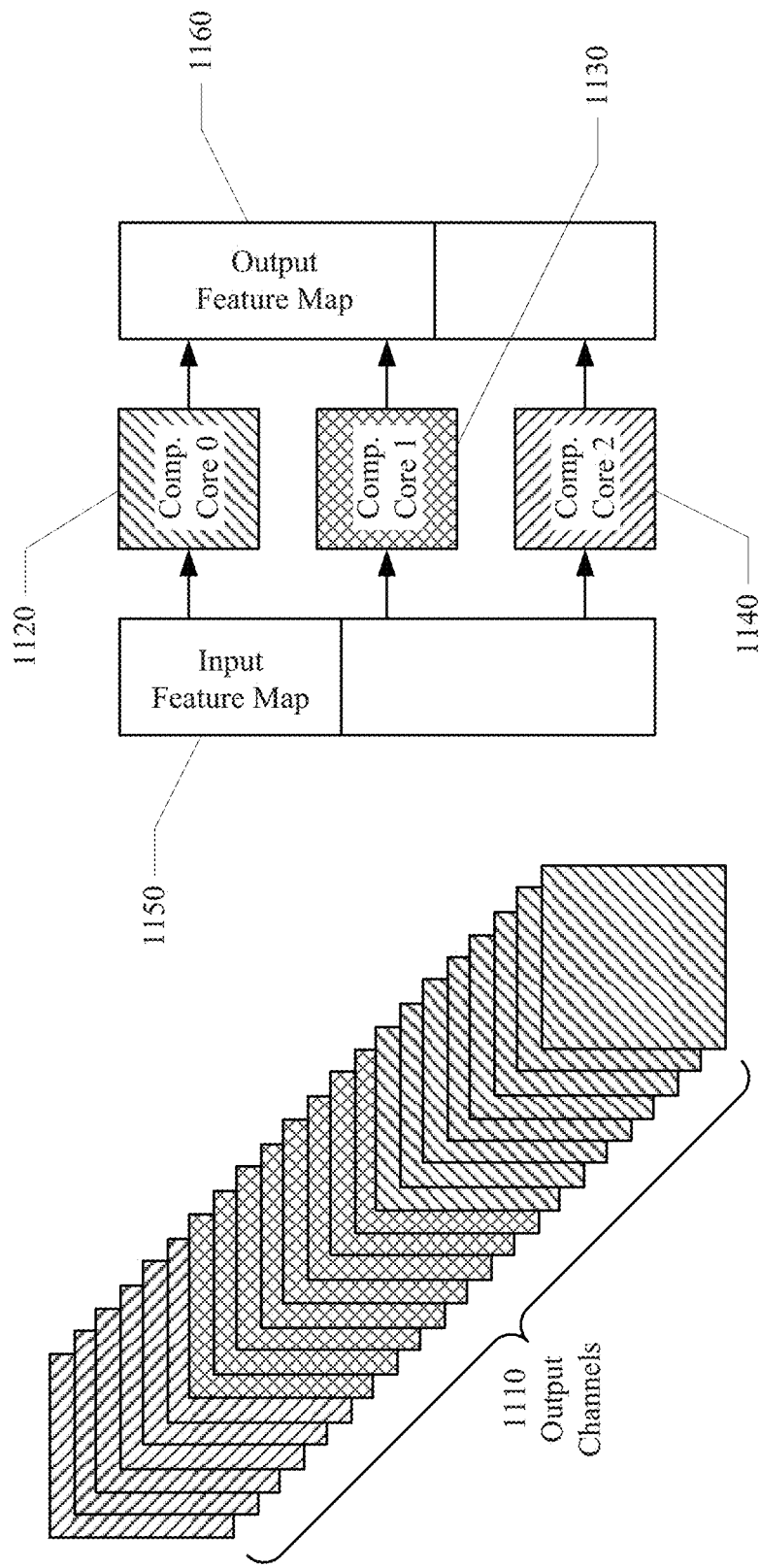
Figure 12:
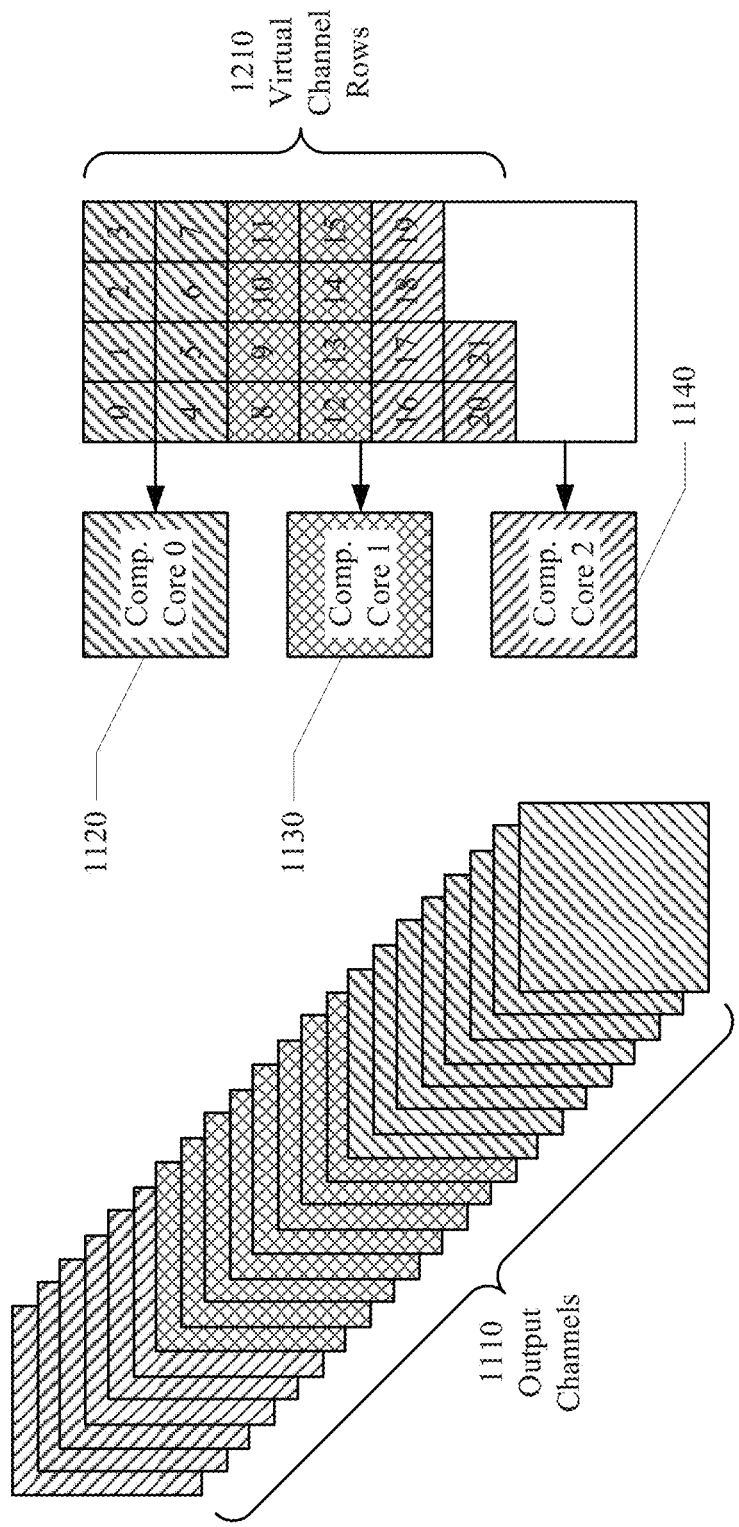

Referring now to FIG. 9, a whole channel compute core configuration, in accordance with aspects of the present technology, is shown. The compute cores, of a given processing region, can be configured in whole channel mode, wherein one or more compute cores perform computations independently of the other compute cores in a respective processing region. In the whole channel mode, the compute cores do not pass data 910 sequentially from a given compute core to an adjacent compute core. Referring now to FIG. 10, in the whole channel mode, each compute core in the cluster computes a designated number of channels. Each of the cores is responsible for reading data and writing the output result on their own. For example, a whole channel mode configured compute core reads data from the $X^{th}$ portion of the first memory region, and optionally the second memory region, performs a corresponding calculation and stores the result in the $(X+1)^{th}$ portion of the first memory region. The compute cores in whole channel mode do not share data with other compute cores and work as standalone compute cores. Referring now to FIG. 11, an exemplary whole channel compute core configuration is illustrated. In the illustrated example, the mapping unit has 22 output channels 1110 and is mapped to a three-compute core cluster 1120-1140. Each compute core has four output physical channels. An input feature map 1150 is stored in an adjacent first portion of the first memory region, and an output feature map 1160 is stored in an adjacent second portion of the first memory region. As further illustrated in FIG. 12, each compute core 1120-1140 is configured to access weights for the respective output channels. Each compute core is configured to compute a product of the input feature map and the weights of respective sets of the 22 output channels 1210 of the output feature map. Each compute core is responsible for almost one-third of the computation workload. The second memory region can be organized based on output channels, and result in the 22 output channels 1210 mapped into five and halve virtual channel rows. Although, the compute core cluster is illustrated as mapped over a single macro of the second memory region, the compute core cluster can also be mapped over a plurality of macros of the second memory region.

Figure 14:
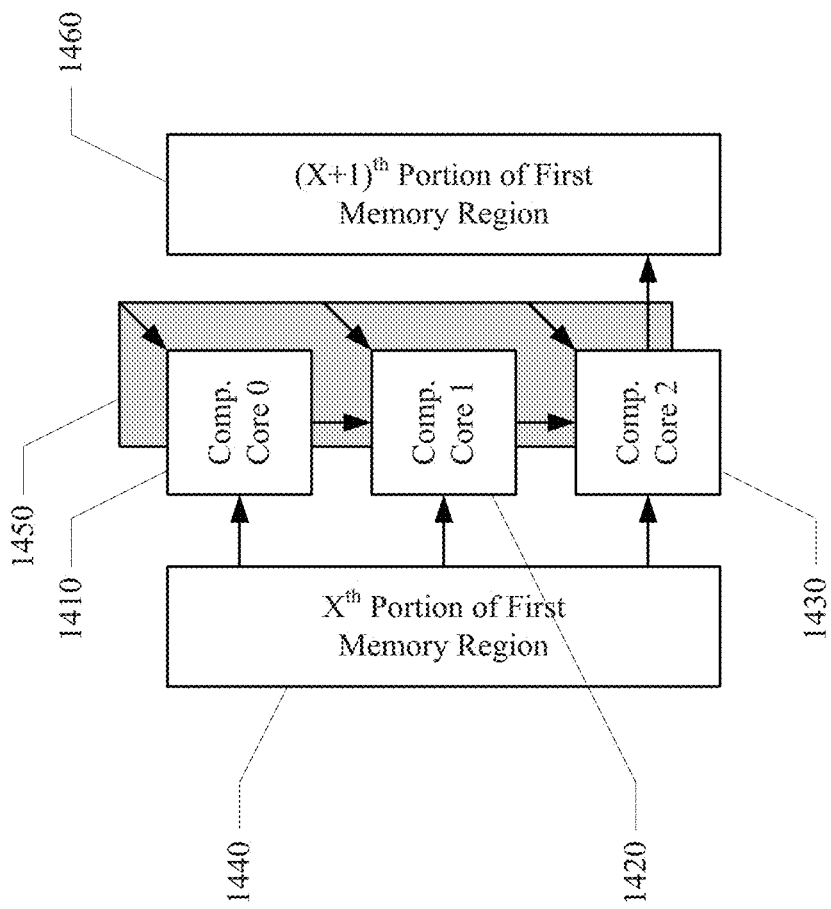
FIGS. 13-16 illustrate a partial sum compute core configuration, in accordance with aspects of the present technology.
Figure 13:
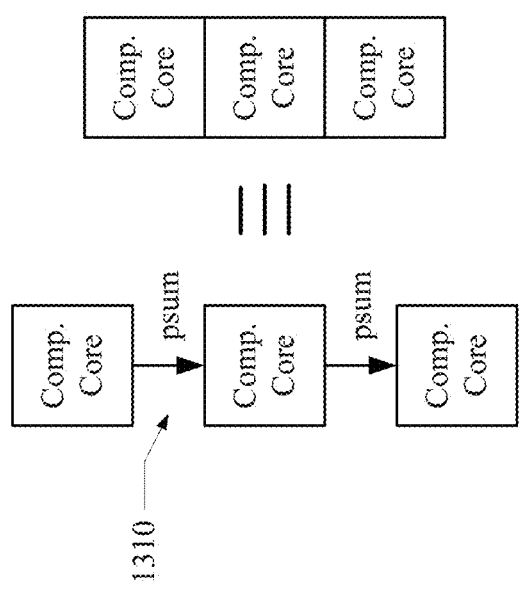
Figure 15:
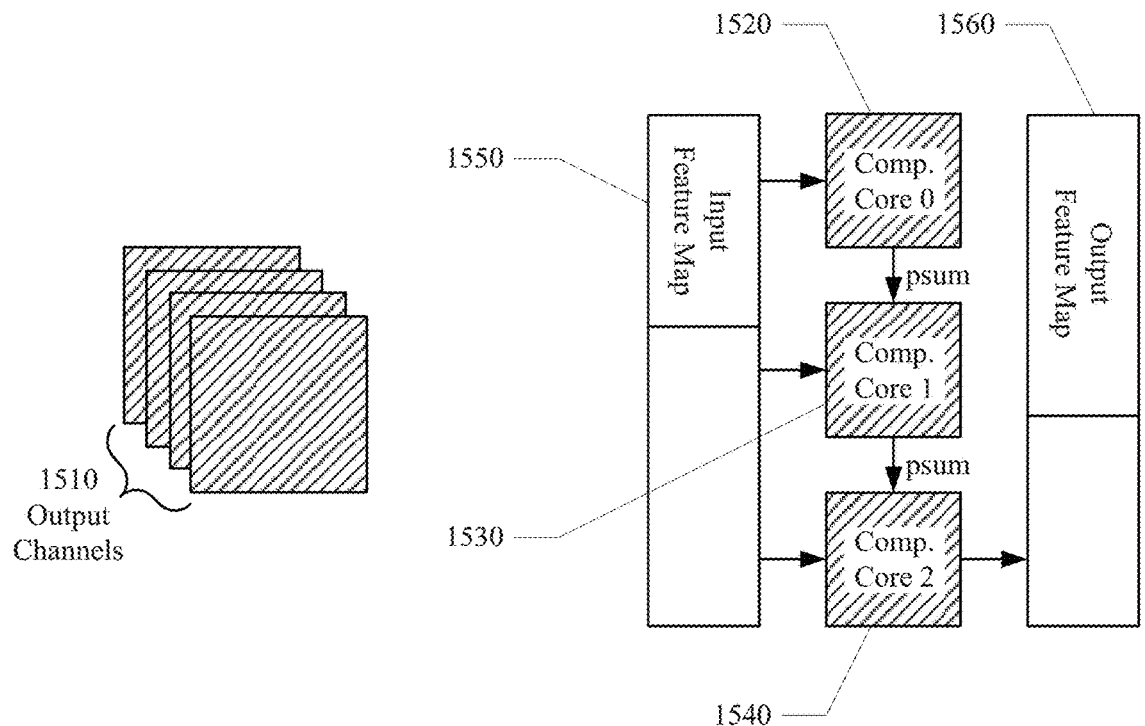
Figure 16:
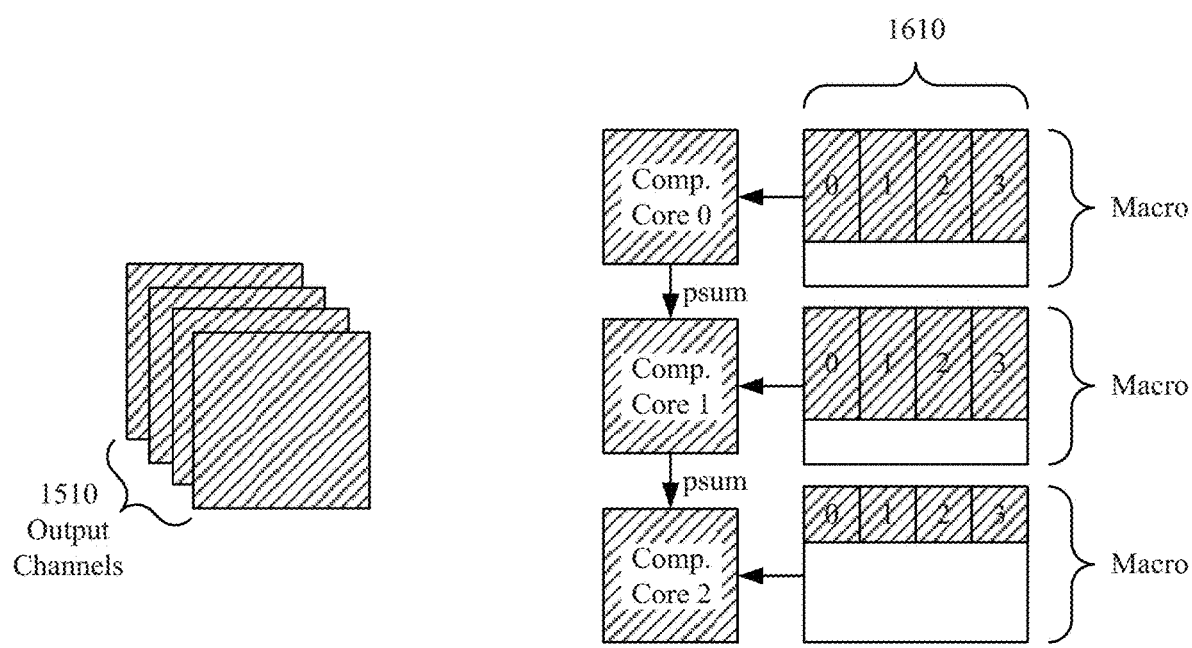

Referring now to FIG. 13, a partial sum compute core configuration, in accordance with aspects of the present technology, is shown. In the partial sum passing mode, one or more compute cores can be configured to perform computations and pass their respective results as a partial sum 1310 to an adjacent compute core within a same processing region for performing a further computation utilizing the partial sum. In the partial sum configuration, the size of data of a single channel cannot fit in a single core slot of the second memory region. In such case, the data can be distributed over multiple macros of the second memory region. In the partial sum configuration, each compute core computes a part of the output and passes it to a neighboring core in the cluster. Hence, the partial-sum mode is equivalent to a compute core with a long second memory region macro. The compute cores 1410-1430 in a partial sum cluster all have access to data in the corresponding portion of the first memory region 1440 and data in the second memory region 1450, and the last core 1430 in the chain will writeback results to the other adjacent portion of the first memory region 1460, as illustrated in FIG. 14. Referring now to FIGS. 15 and 16, an exemplary partial sum compute core configuration is illustrated. In the illustrated example, the partial sum cluster mapping includes four output channels 1510, the mapping is a three-compute core cluster 1520-1540, and each core has four physical channels. As illustrated in FIG. 15, each compute core is configured to access feature map values in a first portion of the first memory region 1550. In addition, each compute core is configured to access weights in the physical channels of the second memory region 1610, as illustrated in FIG. 16. Because the number of output channels is the same as the number of physical channels of the compute cores, all the cores can compute all the output channels. The first compute core 1520 can compute a first partial sum from corresponding portions of the input feature map in the first memory 1550 and corresponding portions of the weights for the four physical channels in the second memory region 1610. The first compute core 1520 can pass the first partial sum to the second compute core 1530. The second compute core 1530 can compute a second partial sum using the first partial sum, corresponding portions of the input feature map in the first memory 1550 and corresponding portions of the weights for the four physical channels in the second memory 1610. The second compute core 1530 can pass the second partial sum to the third compute core 1540. The third compute core can pass the result to an adjacent second portion of the first memory region for storage as output feature map data 1560.

Figure 17:
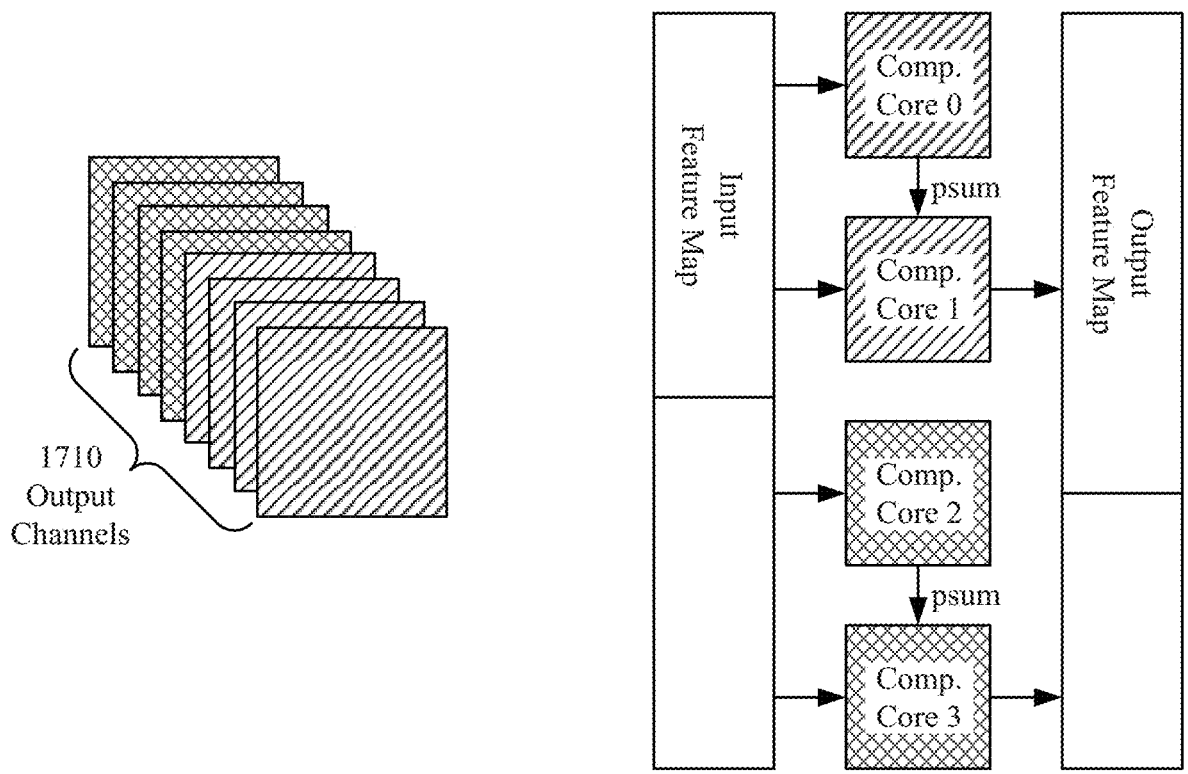
FIGS. 17 and 18 illustrate a partial sum compute core configuration, in accordance with aspects of the present technology.
Figure 18:
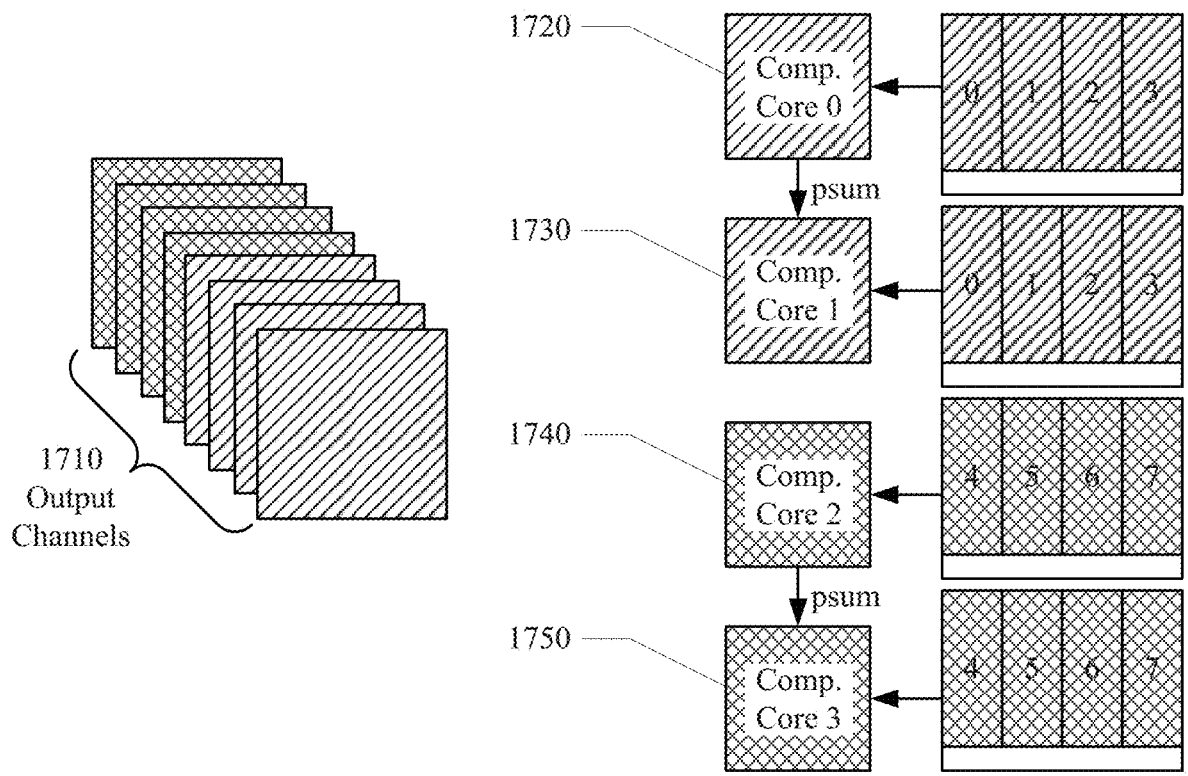

In another example, the partial sum cluster mapping can include eight output channels 1710, four compute cores 1720-1750, and each core has four physical channels, as illustrated in FIGS. 17 and 18. Accordingly, there are more output channels than there are physical channels of the compute cores in the cluster. Because the compute cores cannot compute more output channels than they have physical channels in the case of computing partial sums, the four compute cores of the cluster can be configured into two subsets to compute the eight output channels. Each subset of compute cores will pass partial sum data therein. Each compute core computes four corresponding output channels.

In other cases, the compute cores can compute more output channels than the physical channels. For example, if the compute core has eight physical channels and 32 output channels have been assigned, the compute core can compute eight channels at a time in a sequential manner. However, if more compute cores are available, the output channels can be distributed across the additional compute cores to speed up the process. In such case the same 32 output channel can be computed across two compute cores for example, wherein each compute core is assigned 16 output channels to compute.

Figure 19:
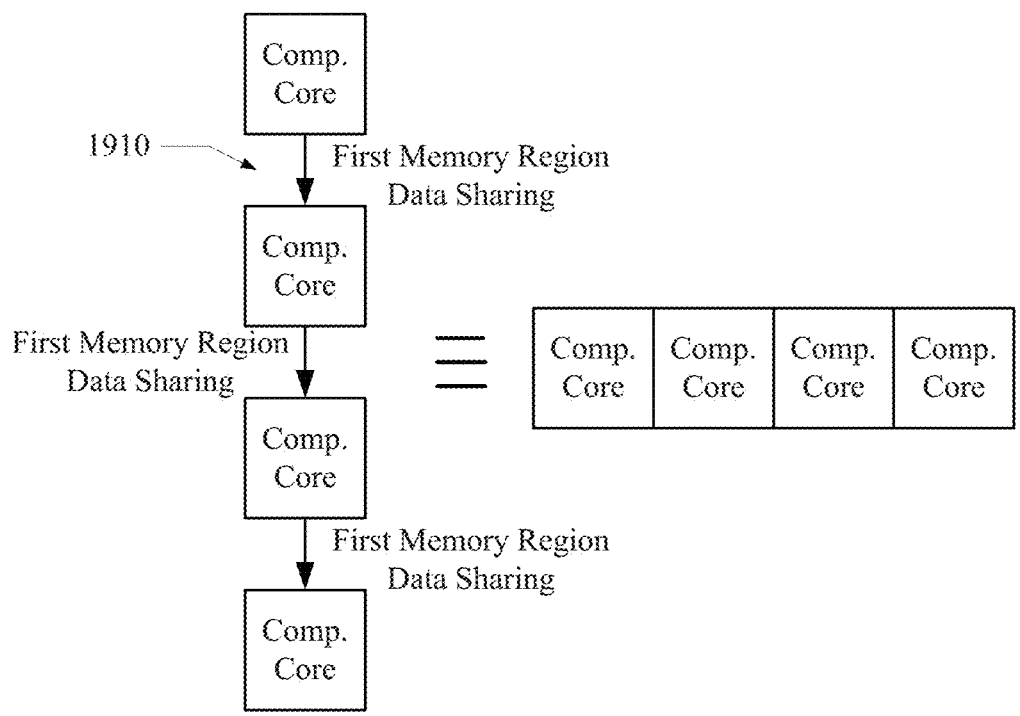
FIGS. 19-22 show a first memory region polymorphic compute core configuration, in accordance with aspects of the present technology.
Figure 20:
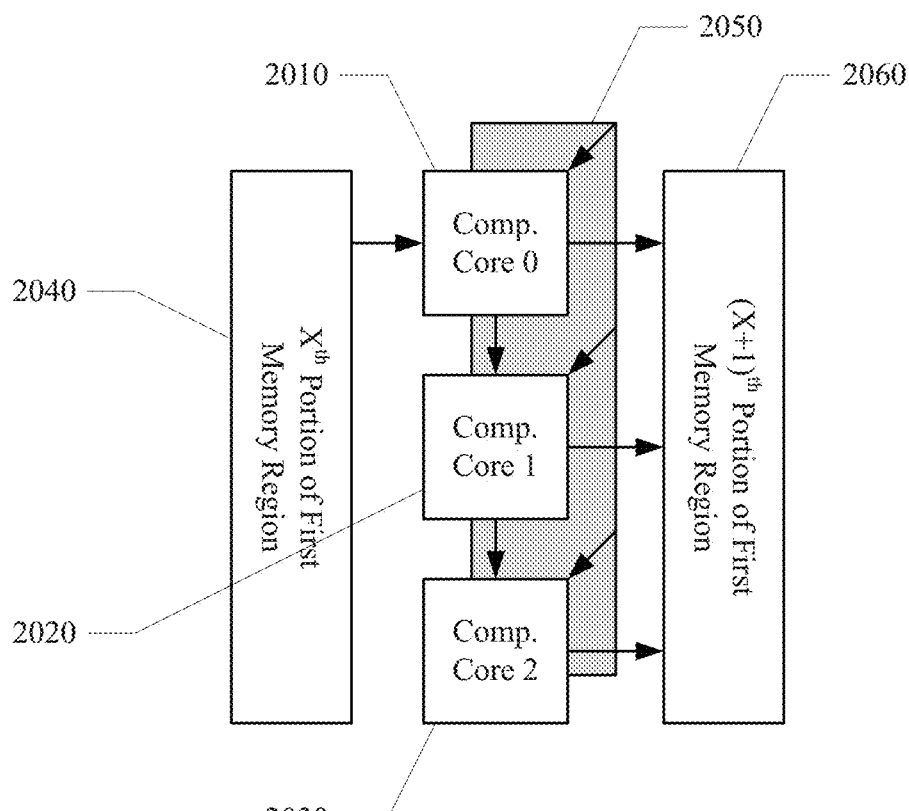
Figure 21:
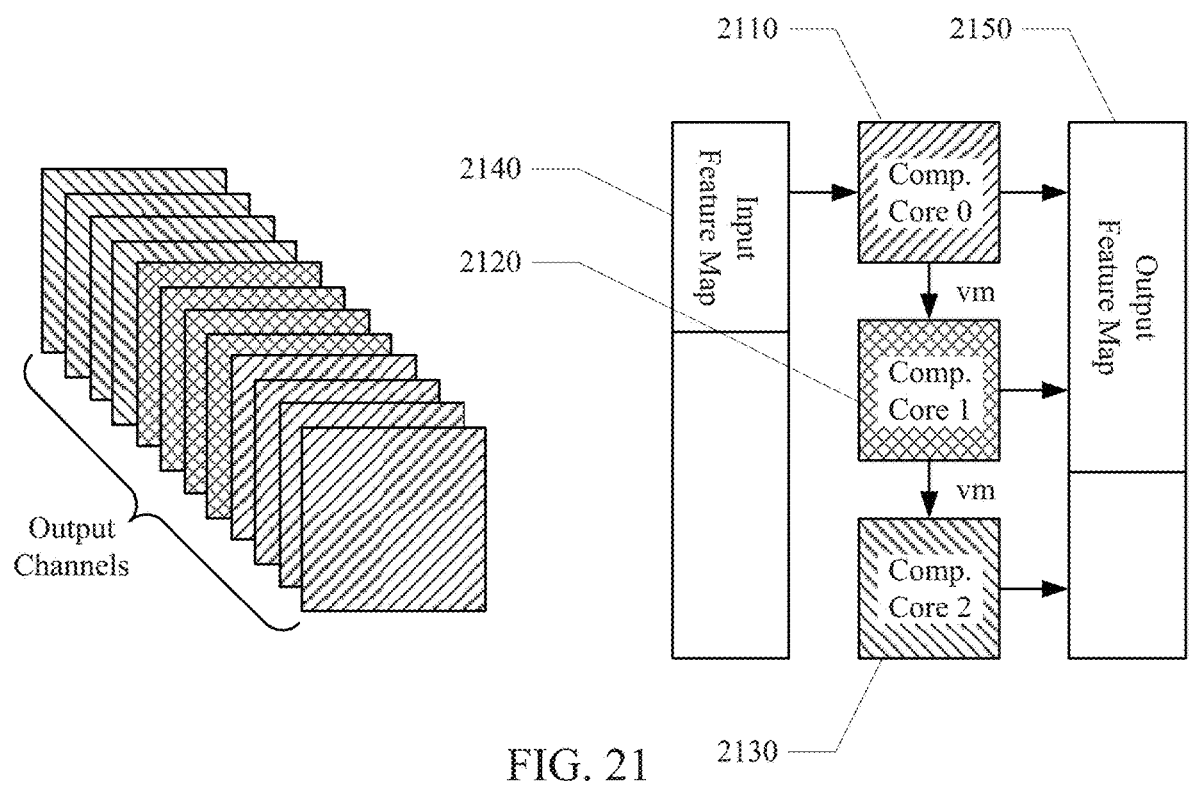
Figure 22:
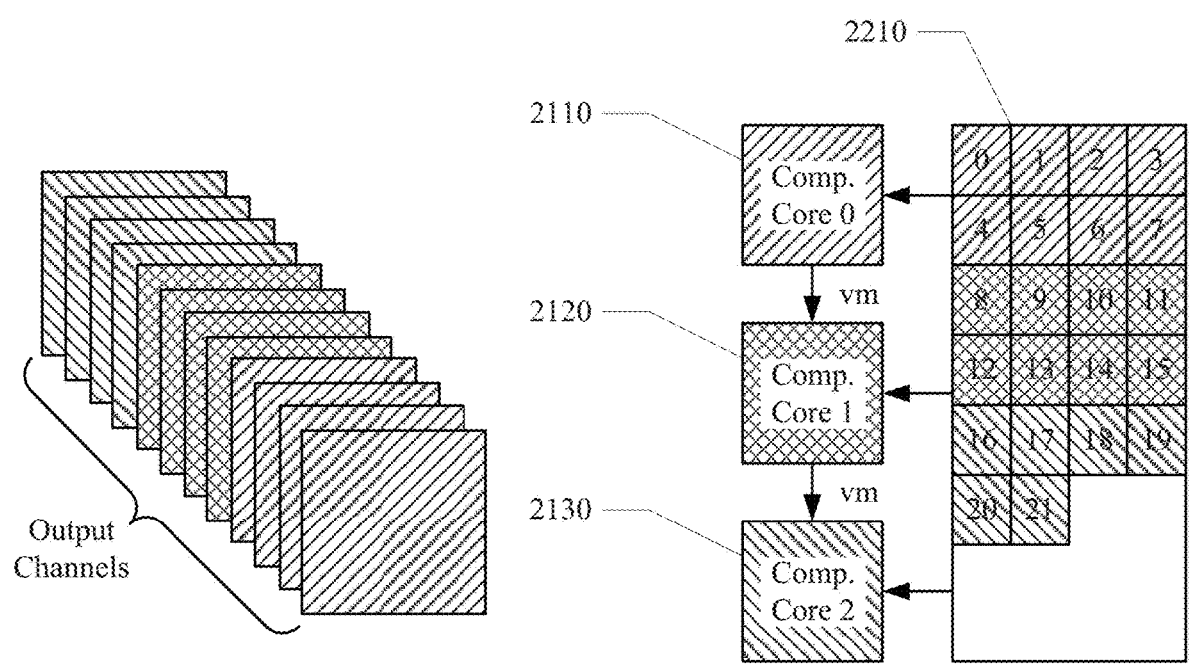

Referring now to FIG. 19, a polymorphic first memory compute core configuration, in accordance with aspects of the present technology, is shown. The compute cores, of a given processing region, can be configured in a polymorphic configuration, wherein one or more cores share data from a given portion of the first memory region 1910 with adjacent compute cores. The polymorphic first memory compute core configured cluster is equivalent to a wider core with more physical channels. Such a configuration can be used to improve reuse of data in the first memory region and reduce the total number of accesses to the corresponding portion of the first memory region. It should also be noted that reuse of data in the first memory region is also an inherent property of the compute core configuration of the plurality of processing region in accordance with aspects of the present technology because the compute cores can share data among the physical channels. The first compute core 2010 in a polymorphic first memory compute cluster has access to data in the corresponding portion of the first memory region 2040 and can share the data with the other compute cores 2020, 2030 in the cluster. All the compute cores 2010-2030 in the polymorphic first memory configuration have access to data in the second memory region 2050, and all of the compute cores 2010-2030 can write results to the other adjacent portion of the first memory region 2060, as illustrated in FIG. 20. Referring now to FIGS. 21 and 22, an exemplary polymorphic first memory region compute core configuration is illustrated. In the illustrated example, the first compute core 2110 of a cluster can access input feature map data in a first adjacent portion of the first memory region 2140. The first compute core 2110 can share in the data of the input feature map with the other compute cores 2120, 2130 of the cluster, as illustrated in FIG. 21. Each compute core 2110-2130 in the cluster can also access data in the second memory region 2210, as illustrated in FIG. 22. Each compute core 2110-2130 in the cluster can then perform a respective computation and write the results as output feature map data to the other adjacent portion of the first memory region 2150, as illustrated in FIG. 21. The polymorphic first memory compute cluster can be configured by a mapping algorithm that starts by creating a whole-channel cluster, then converting to the first memory region polymorphic computer cluster. In the illustrated three compute core cluster, each core can be responsible for up to one third of the computer workload. The second memory region 2210 can be configured to have four output channels, that can be mapped into five and a half virtual channel rows in the second memory region 2210, as illustrated in FIG. 22.

Figure 23:
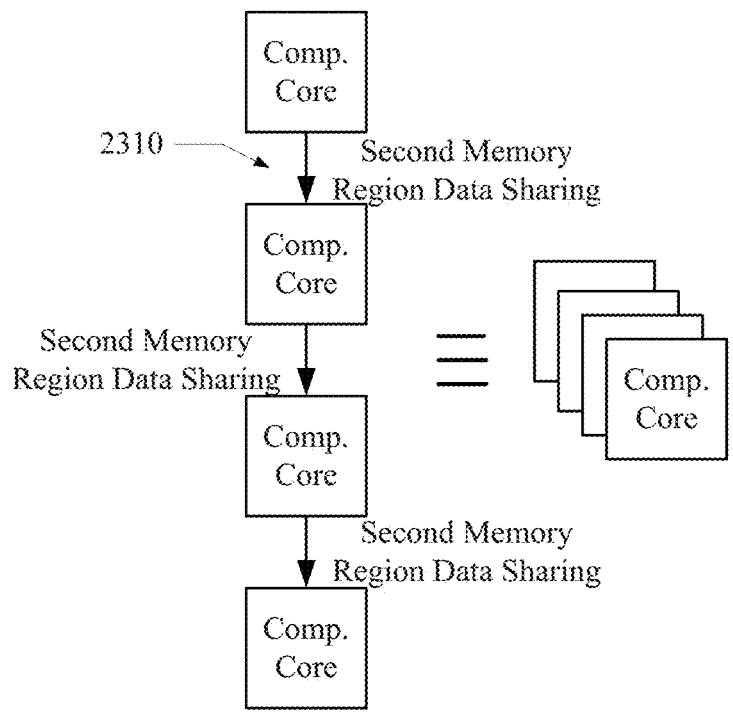
FIGS. 23-26 show a second memory region polymorphic compute core configuration, in accordance with aspects of the present technology.
Figure 24:
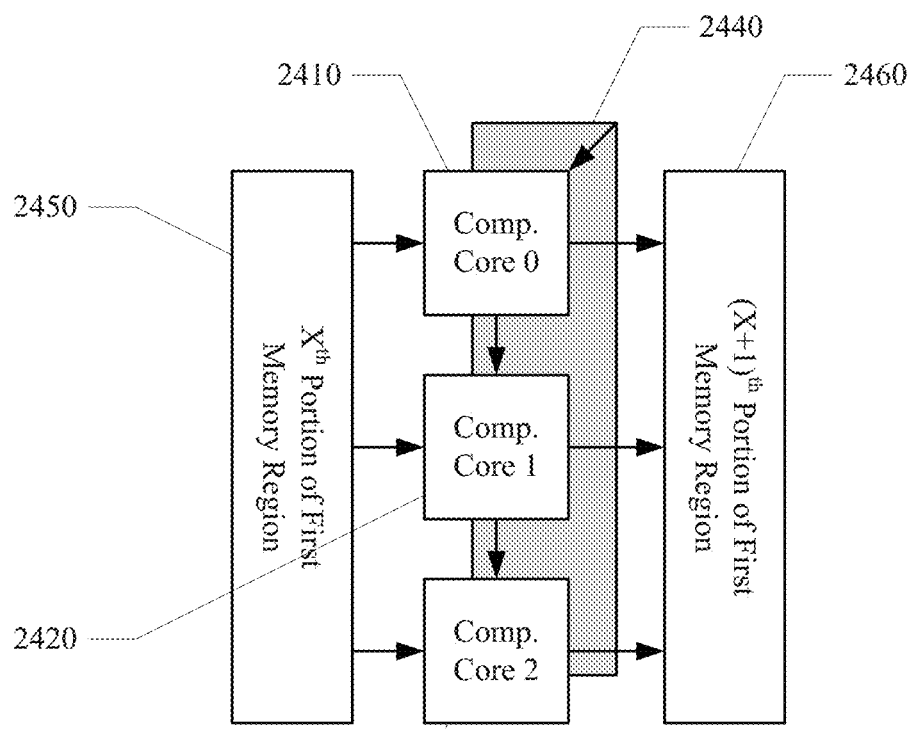
Figure 25:
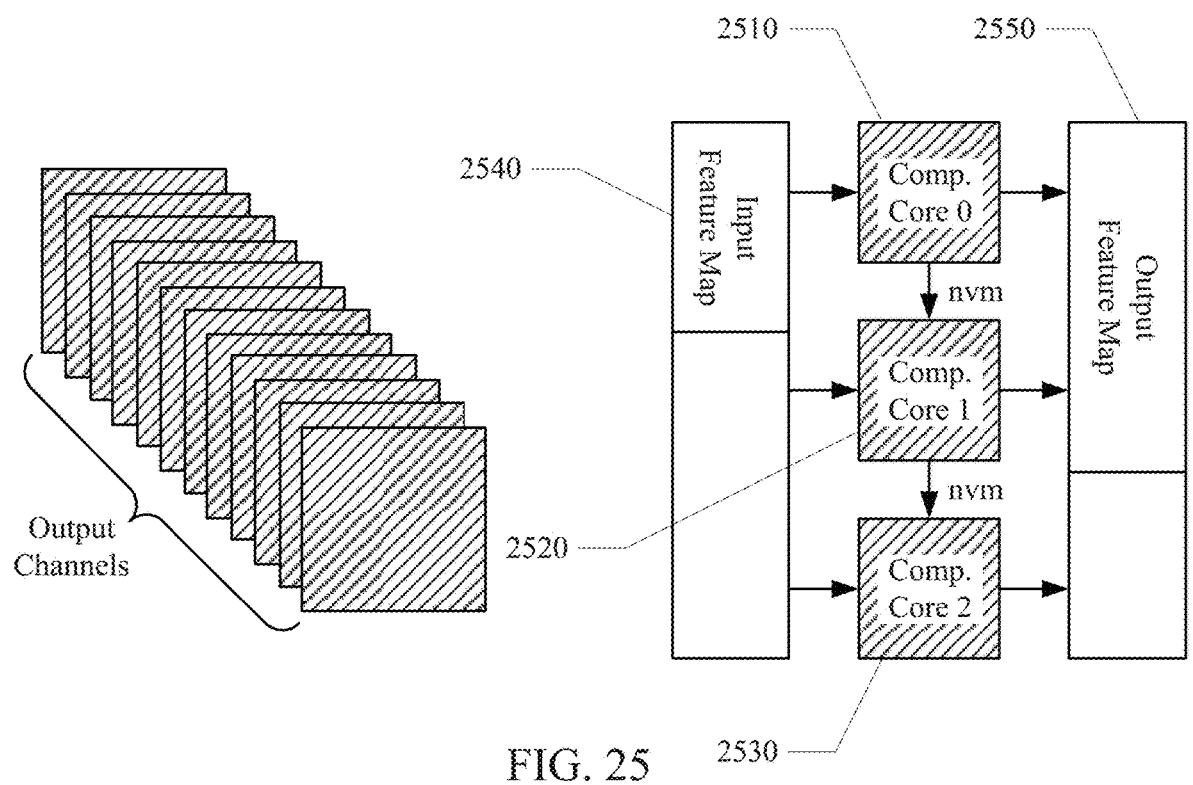
Figure 26:
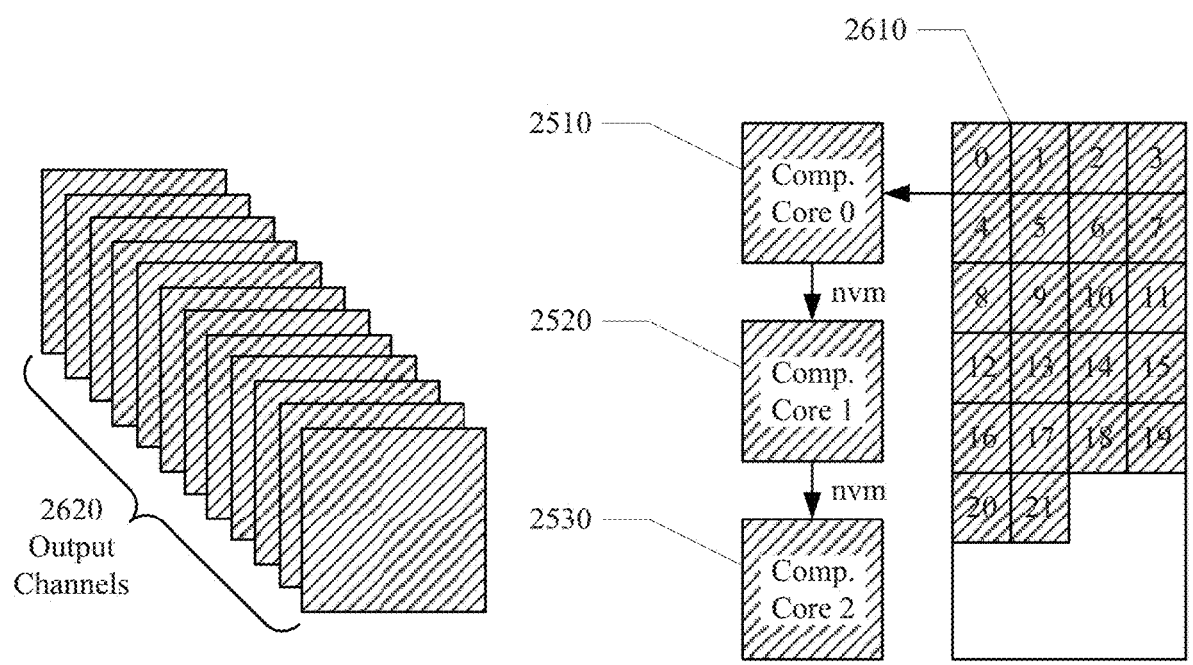

Referring now to FIG. 23, a polymorphic second memory compute core configuration, in accordance with aspects of the present technology, is shown. The compute cores, of a given processing region, can be configured in a polymorphic configuration, wherein one or more compute cores share data from a given portion of the second memory region 2310 with adjacent compute cores. In the polymorphic second memory compute core configuration, each compute core of the cluster can compute all the output channels, but work on different pixels of an output feature map. Accordingly, the other compute cores in the cluster operate as workers for the first compute core. The number of compute cores that can be assigned is the number of mapping unit output feature map pixels. The compute cores of the cluster access a different sequence of data in the second memory region since they are working on different pixels. Such a configuration can be used to reduce the number of access to the second memory region by sharing the data among cores in the cluster. The first compute core 2410 in a polymorphic second memory cluster has access to data in the corresponding portion of the second memory region 2440 and can share the data with the other compute cores 2420, 2430 in the cluster. All the compute cores 2410-2430 in the polymorphic second memory cluster have access to data in the first memory region 2450, and all of the compute cores 2410-2430 can write results to the other adjacent portion of the first memory region 2460, as illustrated in FIG. 24. Referring now to FIGS. 25 and 26, an exemplary polymorphic second memory compute core configuration is illustrated. In the illustrated example, the compute cores 2510-2530 of a cluster can all access input feature map data in a first adjacent portion of the first memory region 2540, as illustrated in FIG. 25. The first compute core 2510 can access data in the second memory region 2610, and share the data with the other compute cores of the cluster 2520, 2530, as illustrated in FIG. 26. In one implementation, the cluster can include 3 compute cores 2510-2530 mapped with a total of 22 output channels. Each compute core can have four physical channels 2620. The top compute core 2510 of the chain is assigned the whole portion of the second memory region 2610 needed by the mapping, and access the whole 22 output channels of data. Each compute core computes all 22 output channels, but for different pixels. The other two compute cores 2520, 2530 of the cluster will access the first compute core 2510 rather than the second memory region 2610 to get weight data. The neighbor access can be done in a dataflow manner without special synchronization. Each compute core 2510-2530 in the cluster can then perform a respective computation and write the results as output feature map data to the other adjacent portion of the first memory region 2550, as illustrated in FIG. 25.

Figure 27:
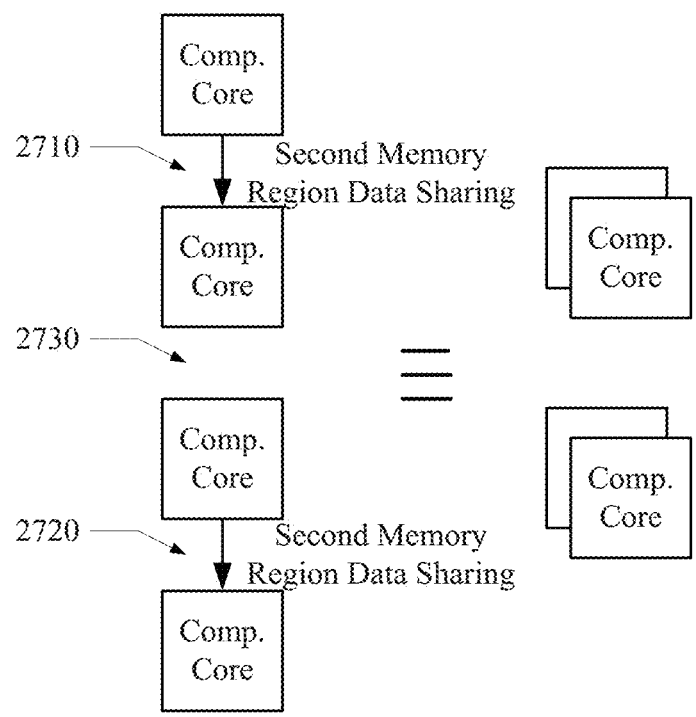
FIGS. 27-30 show a compound compute core configuration, in accordance with aspects of the present technology.
Figure 28:
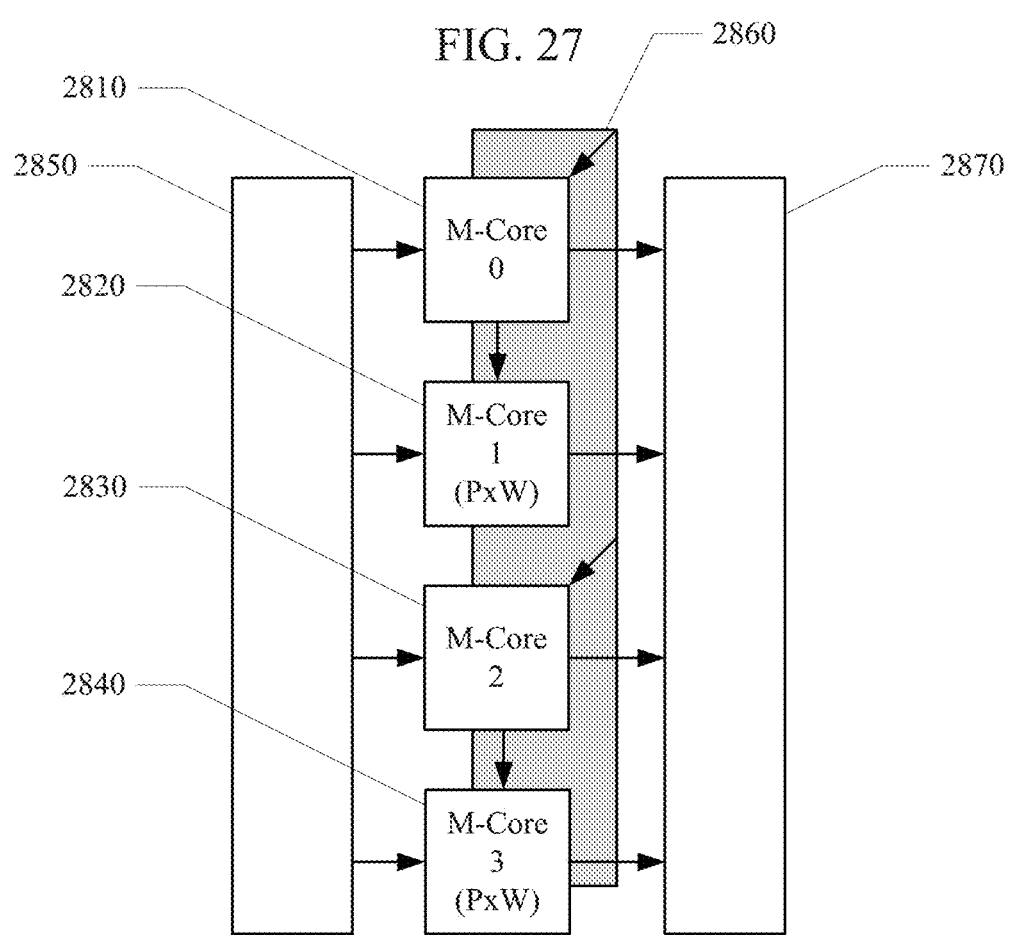
Figure 29:
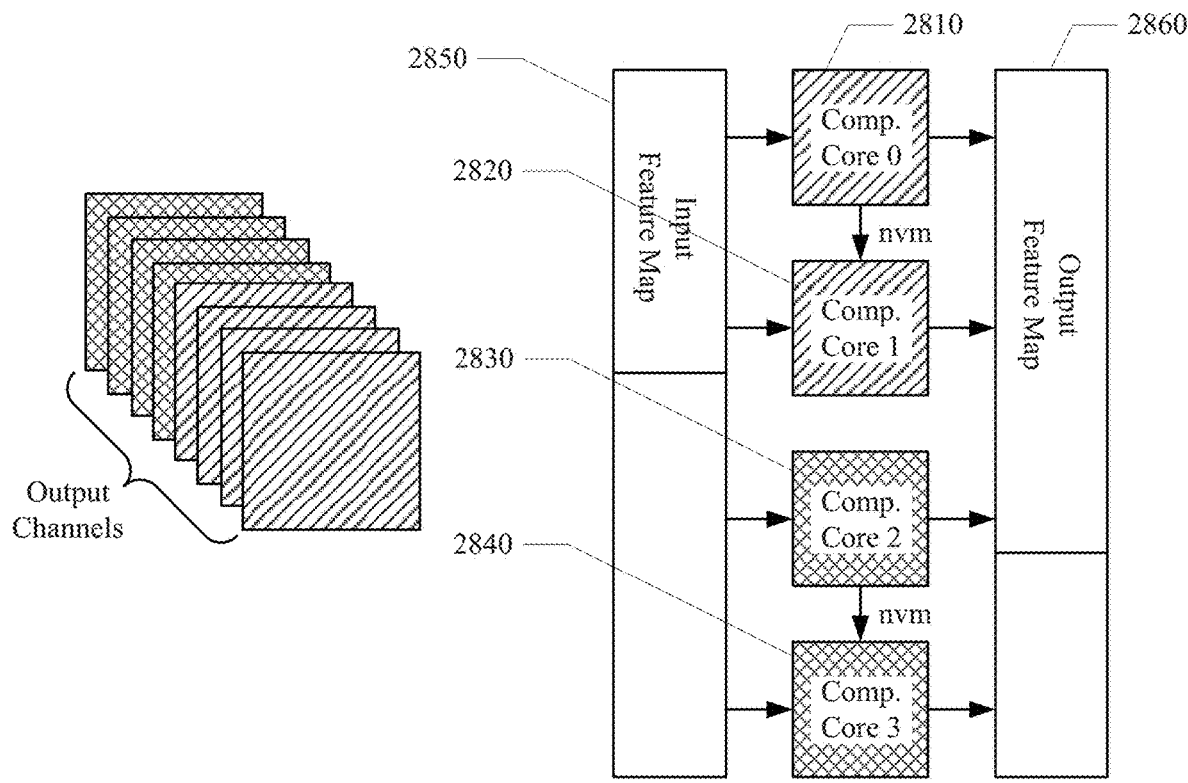
Figure 30:
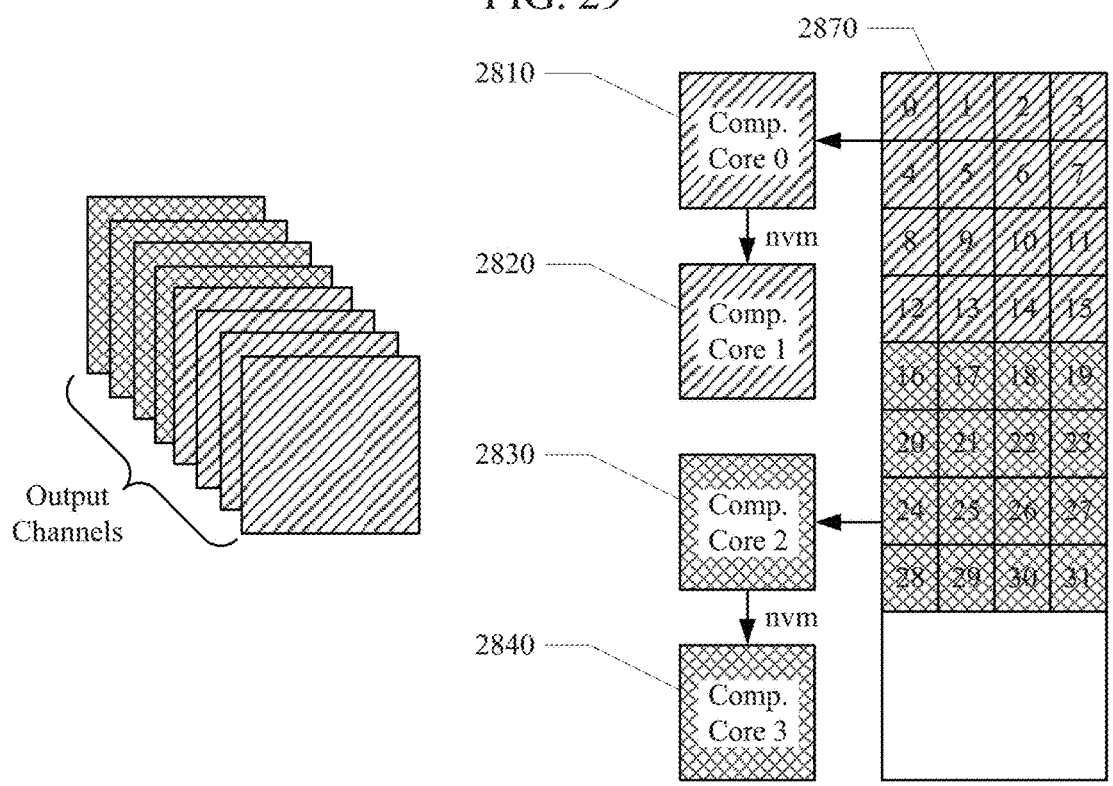

Referring now to FIG. 27, a compound compute core configuration, in accordance with aspects of the present technology, is shown. Each compute core in a cluster, of a given processing region, can access an adjacent portion of the first memory region. The compute cores can also be configured to share data from a given portion of the second memory region 2710, 2720 with adjacent compute cores within the same set. However, compute cores in different sets do not share 2730 data with other compute cores in other sets. The compute cores in each set compute a designated number of output channels and store results into the other adjacent portion of the first memory region. Referring now to FIG. 28, an exemplary compound compute core configuration is illustrated. In the illustrated example, the mapping unit has 22 output channels and is mapped to a four-compute core cluster 2810-2840 including two sets of two compute cores each. For example, a first set can include first and second compute cores 2810, 2820, and a second set can include third and fourth compute cores 2830, 2840. Each set of compute cores can have four physical channels per core. Each compute core 2810-2840 in each set can access input feature map data in the first memory 2850 as illustrated in FIG. 29. The first compute cores 2810, 2830 in a respective set can access weight data in a respective set of output channels in the second memory 2870, as illustrated in FIG. 30. The first compute core in a first set 2810 can be configured to share data from the second memory 2870 with the other compute cores in the first set 2820. Similarly, a first compute core in a second set 2830 can be configured to share data from the second memory 2870 with the other compute cores in the second set 2840. Each compute core 2810-2840 of each set can store result back as output feature map data to the other adjacent portion of the first memory 2860. Accordingly, each set of two compute cores act as stand-alone pixel computing groups. However, the whole result is computed using the two sets of pixel computing groups. At a top level, each of the pixel computing groups can be treated as a standalone compute core set, and the workload can be distributed between them in a whole-channel way.

Figure 31:
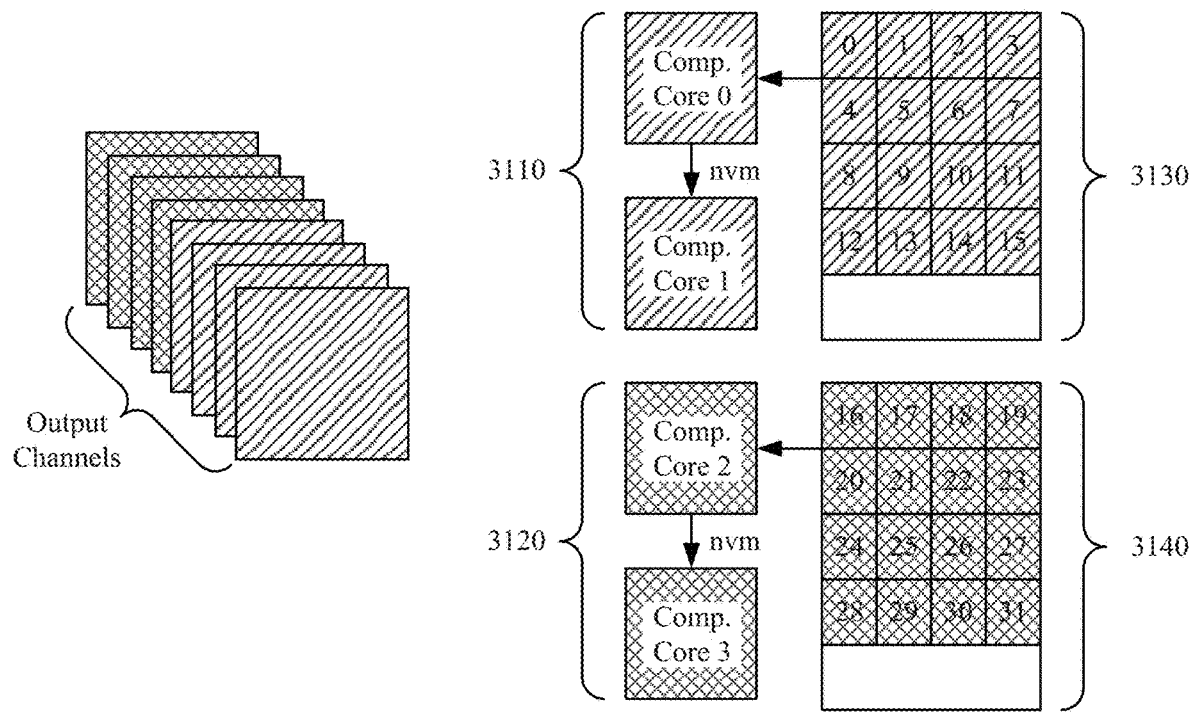
FIG. 31 shows a compound compute core configuration, in accordance with aspects of the present technology.

In another example, the compound configuration can be utilized to distribute pixel computing cores over multiple macros of the second memory region, as illustrated in FIG. 31. In such a configuration, each set of compute cores 3110, 3120 can access respective macros of the second memory region 3130, 3140. Compound clusters can be utilized when a second memory region polymorphic compute core configuration cannot be utilized. Generally, if both sets of compute cores can be used to share data from the second memory region between the compute cores of both sets, the second memory region polymorphic compute core configuration will provide for better data reuse.

Figure 32:
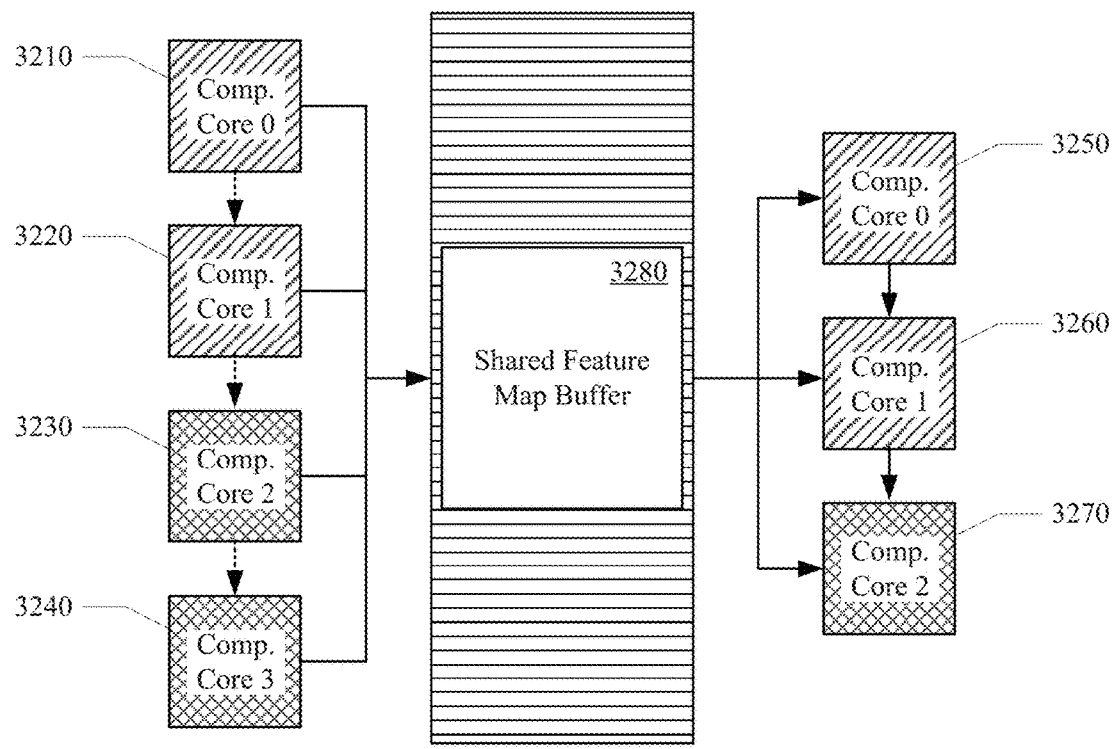
FIG. 32 shows a first memory region sharing feature of the memory processing unit (MPU), in accordance with aspects of the present technology.

Referring now to FIG. 32, a first memory region sharing feature of the memory processing unit (MPU), in accordance with aspects of the present technology, is shown. As illustrated, the dataflow of computations by the MPU can be visualized as a series of produces 310-3240 and consumers 3250-3270. For example, a compute core cluster 3210-3240 can consume input feature map data from a first portion of the first memory region and produce feature map data that can be an input to a next compute core cluster 3250-3270 to use. It is to be appreciated that data sharing in general between conventional computing units tends to be a significant obstacle to conventional dataflow accelerators. Therefore, conventional processing units may utilize network-on-chip and or data duplications. In contrast, the MPU in accordance with aspects of the present technology enables a much simpler data sharing technique, wherein producers and consumers write and read to a shared memory buffer 3280. The buffers 3280 are interleaved portions of the first memory between the plurality of processing regions. Accordingly, data can flow between clusters in the same processing region and or adjacent processing regions. In one implementation, a software layer can be configured to organize the clusters to ensure such adjacency. In the example of FIG. 32, two compute core clusters 3210-3240 and 3250-3270 in two different processing regions share a buffer 3280 in a portion of the first processing region. It is to be appreciated that there is no direct communication between the producer and the consumer compute cores. Compute cores in a compute cluster do not directly synchronize with each other. However, compute cores in a compute cluster can be configured to directly communicate data with each other.

In one implementation, data can be shared between processing regions by assigning a large enough buffer in the corresponding portion of the first memory. For example, the buffer can be allocated to carry a whole feature map shared between adjacent processing regions. The size of the buffer can be calculated in accordance with Equation 1:

$$S_b = \Pi_{\forall i} F[i] \quad (1)$$

where F is the vector of the feature map size.

Figures 33A, 33B:
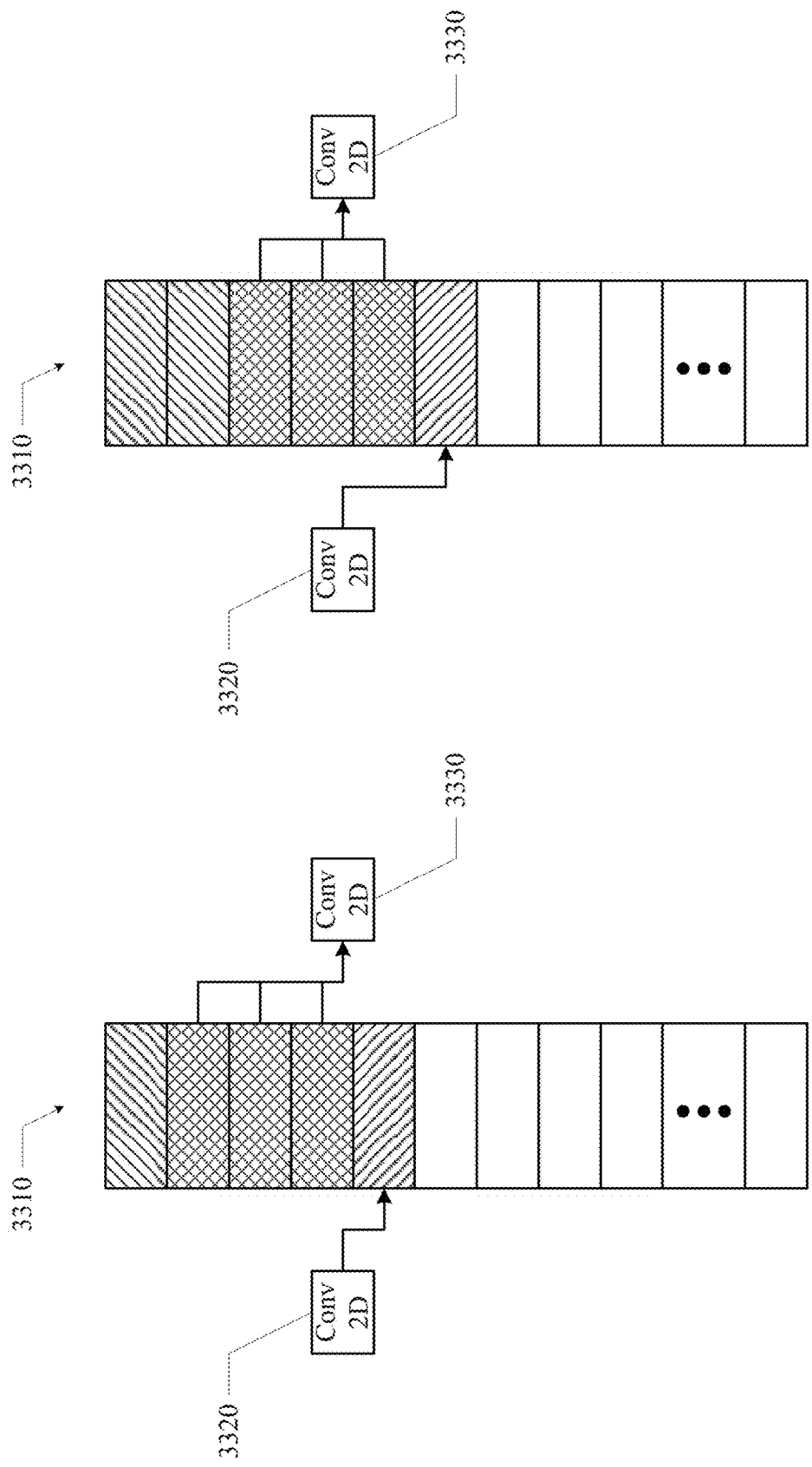
FIGS. 33A and 33B illustrate an exemplary buffer utilization by a consumer and a producer, in accordance with aspects of the present technology.

However, assigning the whole feature map size as a buffer is not enough for the data to flow. Consumers need to avoid reading a buffer entry that is not filled yet by the producer. Assuming a coarse-grain synchronization of the feature map row level, the consumer cannot read from a feature map row that is still being produced. For the sake of simplicity, each feature map row will be illustrated as a single buffer entry in FIGS. 33-46. However, it is appreciated that a single row may require the storage of hundreds, thousands, or even more entries. Referring now to FIGS. 33A and 33B, an exemplary buffer utilization by a consumer and a producer is illustrated. The illustrated buffer 3310 is sized to store a full feature map. The producer 3320, for example, can be performing a two-dimensional convolution, and the consumer 3330 can be performing a two-dimensional convolution having a 3×3 kernel size. The producer core 3320 can generate the pixels of a given feature map row before producing the pixels of a next row. In such case, the producer core 3320 only blocks a single row entry as illustrated in FIG. 33A. As the producer core 3320 generates the pixels of a given feature map row, the consumer core 3330 can access the pixels values of the previous three rows. After the producer core 3320 is done generating the pixels of the given row, the producer core 3320 can move to generate the pixels of the next row as illustrated in FIG. 33B. At that point, the consumer core 3330 can shift its consumption to a next three row window if the consumer core 3330 is ready to start processing the next three row window. Furthermore, it is noted that the rows that have already been consumed can remain in the buffer 3310 until overwritten by the producer core 3320 as processing continues. It is appreciated that the consumer 3330 of a 3×3 kernel consumes three buffer entries simultaneously while the producer 3320 generates data for one entry before moving to the next one. Furthermore, a number of entries in the buffer 3310 are not in use at any given time. Therefore, the full feature map sized buffer 3310 can waste resources in the memory processing unit (MPU).

In another implementation, a smaller partial buffer can be sufficient for the dataflow to support the computations. For example, a circular queue can be utilized as a partial buffer. The partial buffer can be configured to carry enough data for the consumer to operate and have extra entries to allow the producer to generate data while the consumer is working. For example, the partial buffer can include three feature map rows in the case where the consumer is performing a convolution having a 3×3 kernel size. The partial buffer can also include extra entries, referred to as a pipeline margin. Without such a margin, the dataflow performance will degrade significantly since the producer and consumer will not be able to work concurrently. The producer also cannot overwrite data that is not yet consumed, and the consumer needs to wait for the producer to finish writing a new row in the partial buffer before starting to consume it. Referring now to FIGS. 34A-34D, an exemplary shared partial buffer 3410 for a 3×3 kernel size is illustrated. As illustrated, a producer 3420 generates pixel data for a given row before moving on to the next row, and the consumer 3430 accesses three rows of data at a time. By utilizing a partial buffer 3410, the size of the shared buffer 3410 can be reduced to as littles as four rows. For example, in a first cycle the consumer 3430 can be accessing the first three rows of pixel data, and the producer 3420 can be generating data for storing in the fourth row. In a second cycle, the consumer 3430 can be accessing the second through four rows of data, while the producer 3420 is storing data in the first row. In a third cycle, the consumer 3430 can access data in the third, fourth and first rows, while the producer 3420 stores data in the second row. In a fourth cycle, the consumer 3430 can access the fourth, first and second rows, while the producer 3420 stores data in the third row. Thereafter, the first through fourth cycles can be iteratively repeated any number of times. Accordingly, the four-row shared partial buffer can allow the producer and consumer to work smoothly.

Figures 35A, 35B:
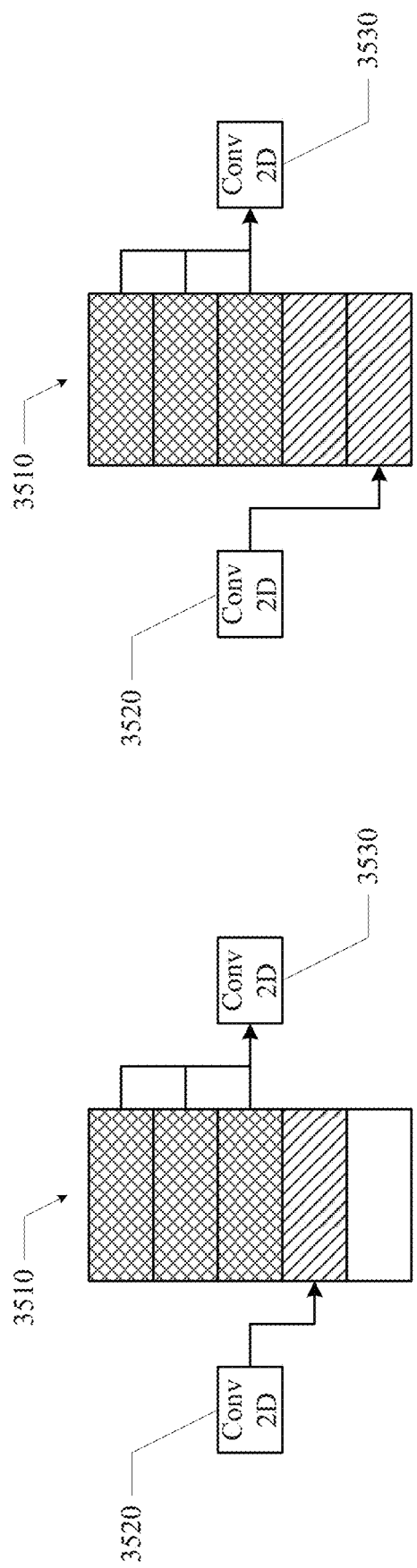
FIGS. 35A and 35B illustrate an exemplary shared partial buffer for a 3×3 kernel size with a 2×2 stride, in accordance with aspects of the present technology.

Referring now to FIGS. 35A and 35B, an exemplary shared partial buffer for a 3×3 kernel size with a 2×2 stride is illustrated. A consumer 3530 having a stride of 2×2 moves its window two rows at a time. Therefore, a pipeline margin of two is needed to allow the producer to generate the necessary rows for the consumer window shift. For example, a producer 3520 can store data in a fourth and fifth row, while the consumer 3530 accesses data in the first through third rows. After the producer 3520 stores data in the fourth and fifth rows, the consumer 3530 can move to accessing data in the third through fifth rows, while the producer 3520 stores data in the first and second rows.

Figure 36:
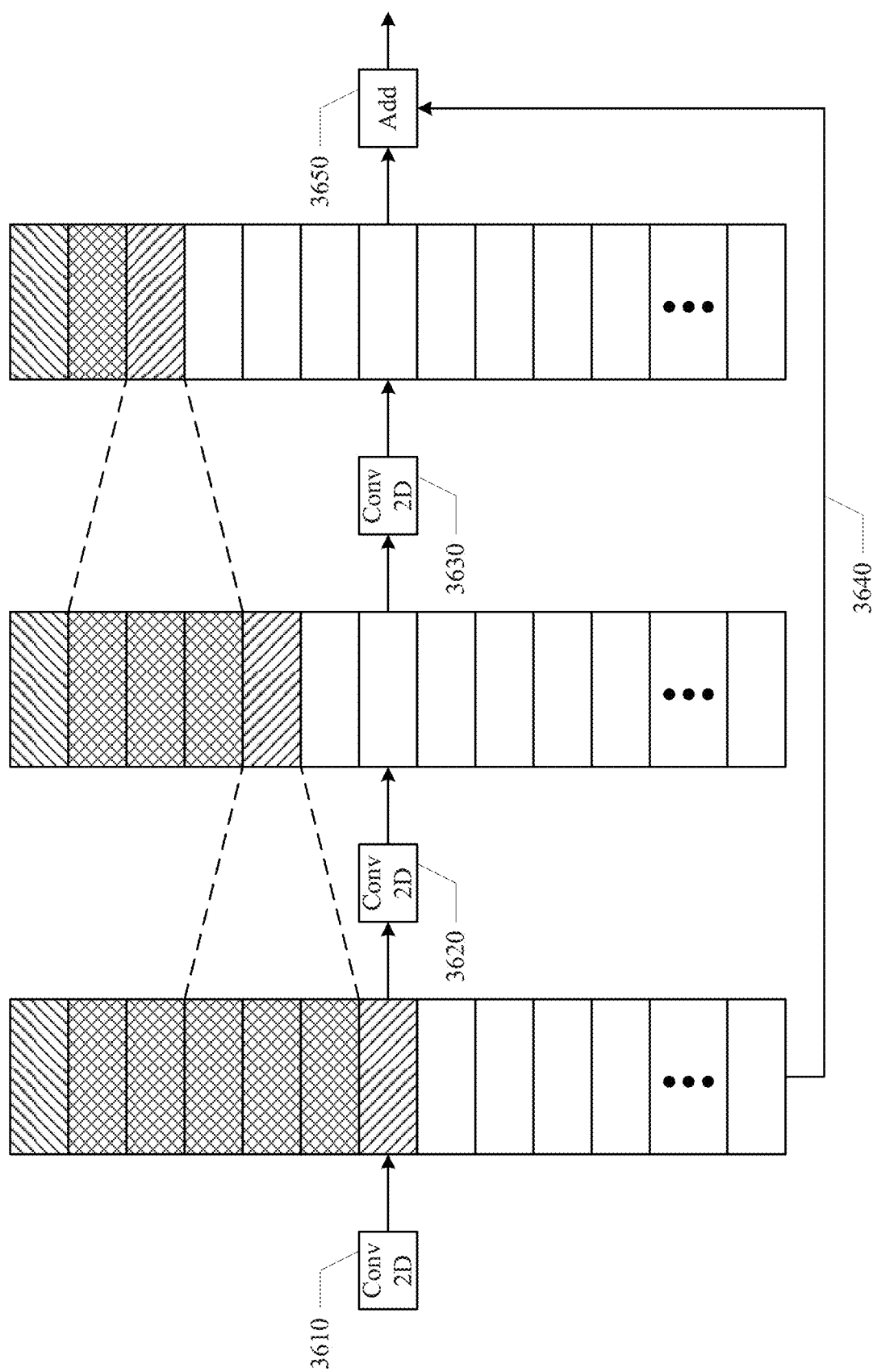
FIG. 36 illustrates an example branching dataflow utilizing a full feature-map buffer, in accordance with aspects of the present technology.

For ease of explanation, aspects of the present technology have been described with regard to a single producing cluster and a single consuming cluster. However, dataflow in the memory processing unit (MPU) can involve dataflow branching into multiple paths that can for example end as different outputs, merge again, and the like. While branching output can be treated the same as multiple single dataflow paths, merging branches can involve additional considerations. If a neural network with merging branches, for example, is not allocated the correct buffer size, the dataflow pipeline might end up in a deadlock or produce incorrect data. With data having multiple consumers, the data validity should be set by the slowest consumer. Typically, a longer data lifetime results in a need for a larger buffer size. Referring now to FIG. 36, an example branching dataflow utilizing a full feature-map buffer is illustrated. As illustrated, a first producer 3610 can perform a convolution (Conv2D) operation, which is consumed by two branches. A first branch, can for example, include a series of two convolution (Conv2D) operations 3620, 3630 of a kernel size of 3×3. A second branch can include a skip connection 3640, for example. The two branches can then be merged together, for example, with the aid of an addition (Add) operation 3650. Each of the convolution (Conv2D) operations 3620, 3630 in the first branch need three ready rows to access for input data. In addition, an extra row is also needed as a pipeline margin. The add operation 3650 does not have any kernels and therefore only needs a single ready row to operate. However, the producer data cannot be outdated based on the convolution (Conv2D) consumers 3620, 3630. Data needs to stay in the buffer until the Add merge node 3650 is ready to use it.

Figure 37:
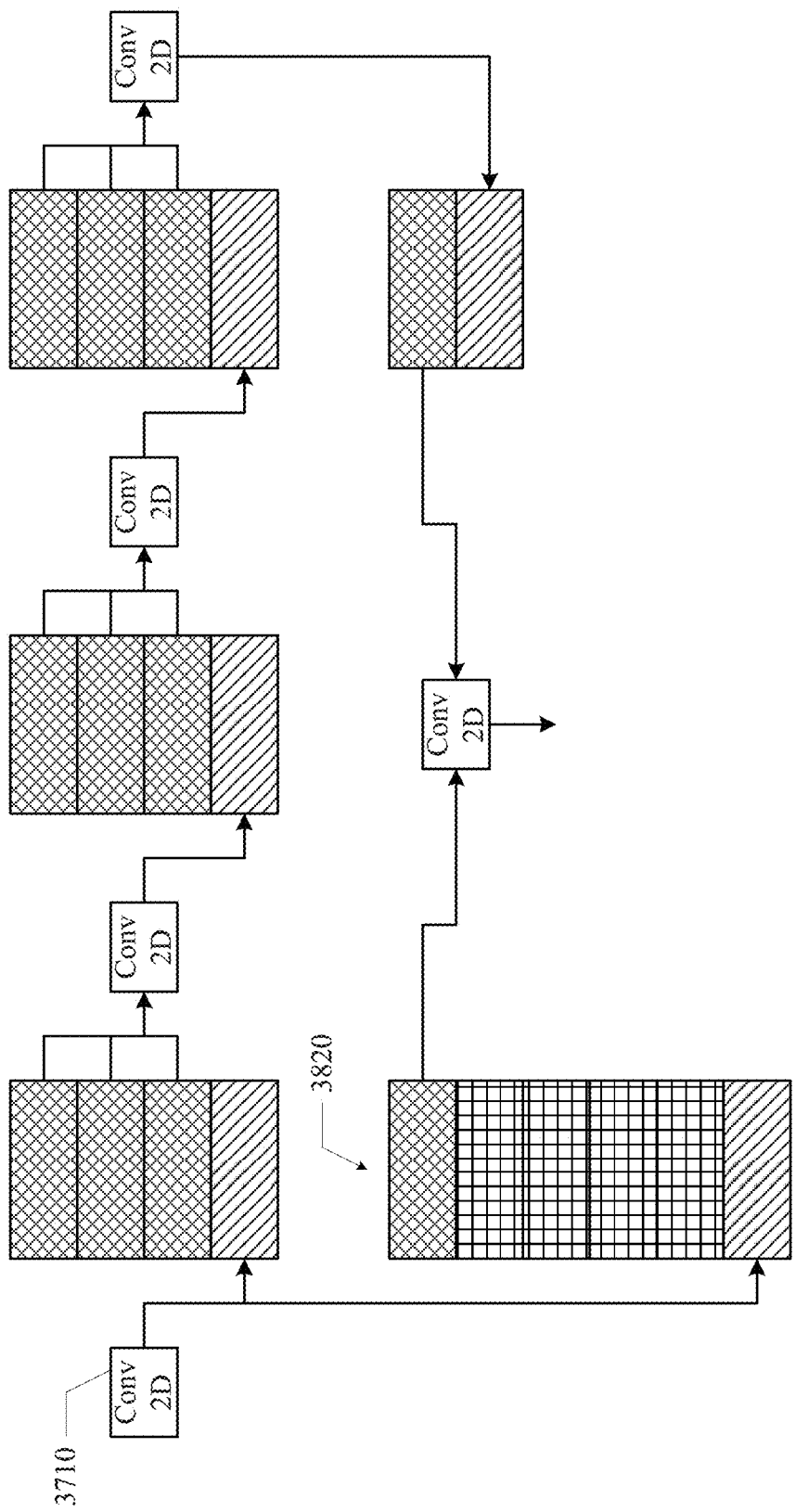
FIG. 37 illustrates an exemplary branching dataflow utilizing a partial feature-map buffer, in accordance aspects of the present technology.
Figure 38:
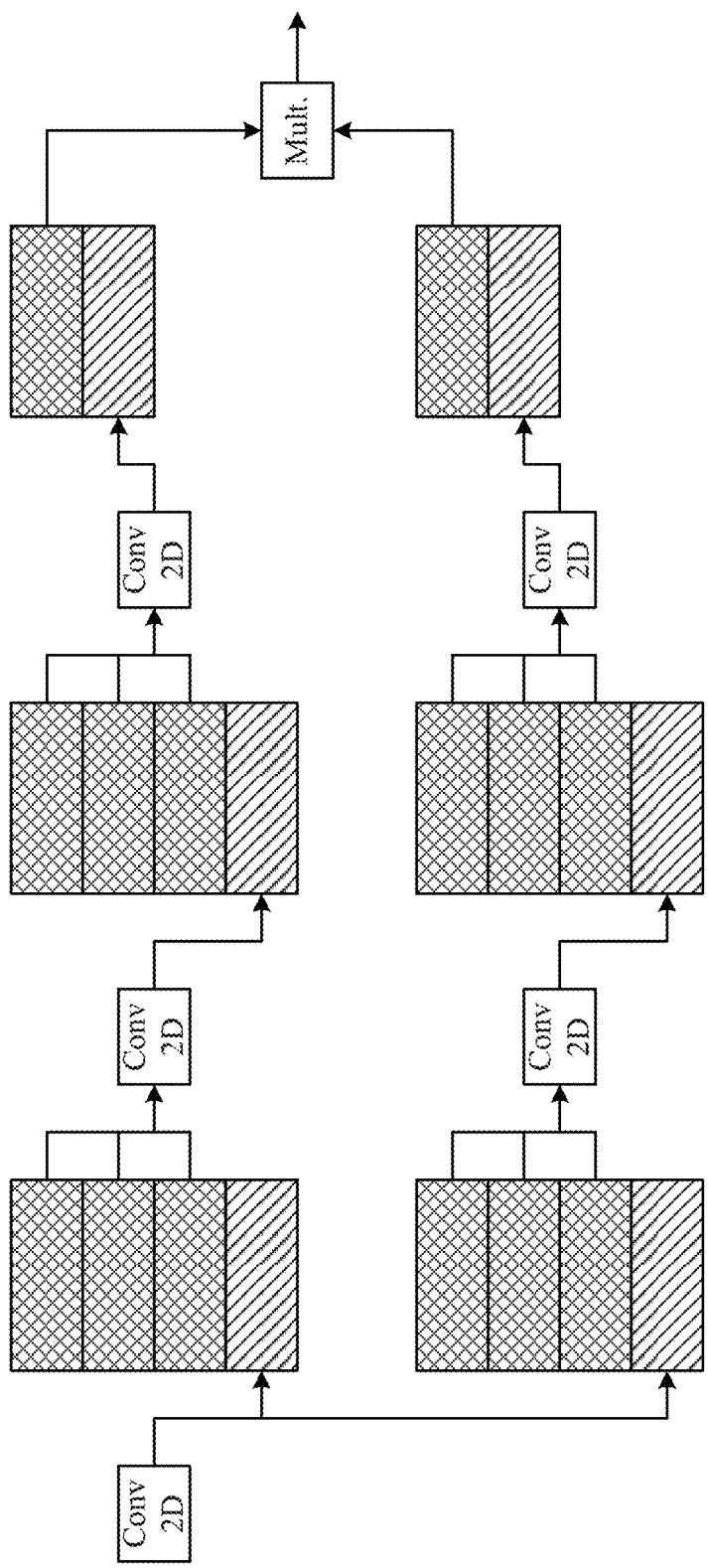
FIG. 38 illustrates an exemplary branching dataflow utilizing a partial feature-map buffer, in accordance aspects of the present technology.

Referring now to FIG. 37, an exemplary branching dataflow utilizing a partial feature-map buffer is illustrated. As illustrated, the producer 3710 at the start of the branch produces two sets of data for consumers (with the aid of bypass operations) of the two branches to facilitate data synchronization. The faster branch is configured to buffer 3720 more data to align with the slower branch, which can be referred to as the branch delay data. It is to be appreciate that not all branches require a delay buffer. For example, balanced branches do not require extra data storage, as illustrated in FIG. 38. As illustrated, each of the two branches can be configured with a typical size of partial buffer as if each branch is the only data path.

Although the shared buffer can be synchronized on a row-wise basis as described above, the shared buffer can also be synchronized on other granularities. For example, a shared buffer in the first memory region can also be synchronized on pixel basis as illustrated in FIGS. 39A and 39B. As illustrated, a producer can perform a convolution (Conv2D) operation, which is consumed by two branches. The first branch can be made of three convolution (Conv2D) operations 3910-3930 in series, two of which can have a kernel size of 1×1 while the other has a 3×3 kernel size. The second branch 3940 can be a skip connection. The two branches can merge together at an addition (ADD) operation 3950. The 1×1 kernel size convolution (Conv2D) operations 3910, 3930 can utilize a two pixel buffer size, while the 3×3 convolution (Conv2D) operations can utilize at least three rows. It should be noted that the pixels can consume multiple buffer entries based on the number of output channels.

Coarse grain synchronization can offer less overhead and pipeline stalls. In contrast, fine-grain buffer entries can reduce the required buffer size at the expense of synchronization steps. The buffer reduction can be noticeable in the case of kernel-less operation and 1×1 kernels. However, in the case of larger kernels, the gains for the fine grain configurations tend to be smaller. The gain can almost diminish in striding, fused pooling, multi-row producer and the like configurations. In general, the granularity of the synchronization can be a design choice rather than a property of the architecture.

The foregoing descriptions of specific embodiments of the present technology have been presented for purposes of illustration and description. They are not intended to be exhaustive or to limit the present technology to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A memory processing unit (MPU) comprising:
a first memory including a plurality of regions;
a plurality of processing regions interleaved between the plurality of regions of the first memory, wherein the processing regions include a plurality of compute cores configurable in one or more clusters, wherein the plurality of compute cores of respective ones of the plurality of processing regions are coupled between adjacent ones of the plurality of regions of the first memory, and wherein the plurality of compute cores of respective ones of the plurality of processing regions are configurably couplable in series; and
a second memory coupled to the plurality of processing regions.

2. The MPU of claim 1, wherein:
the first memory comprises an activation memory; and
the second memory comprises a weight memory.

3. The MPU of claim 1, wherein:
the first memory comprises a static volatile memory; and
the second memory comprises a non-volatile memory.

4. The MPU of claim 1, wherein the plurality of cores of respective ones of the plurality of processing regions includes a plurality of near memory (M) cores.

5. The MPU of claim 4, wherein the plurality of cores of one or more of the plurality of processing regions further includes one or more arithmetic (A) cores.

6. The MPU of claim 4, wherein the plurality of cores of one or more of the plurality of processing regions further includes one or more input/output (I/O) cores configured to access input and output ports of the MPU.

7. The MPU of claim 1, wherein data is configurably moveable between respective ones of the plurality of processing regions and respective adjacent ones of the plurality of regions of the first memory.

8. The MPU of claim 1, wherein data is configurably moveable from the second memory and to the plurality of processing regions.

9. The MPU of claim 1, wherein data is configurably moveable between adjacent ones of the plurality of cores of respective ones of the plurality of processing regions.

10. The MPU of claim 1, wherein the plurality of cores of respective ones of the plurality of processing regions are configurable for a plurality of modes comprising:
partial sum passing mode;
first memory region sharing mode; and
second memory sharing mode.

11. The MPU of claim 1, further comprising: an inter-layer-communication (ILC) unit configured to synchronize data movement between one or more compute cores producing given data and one or more other compute cores consuming the given data.

12. The MPU of claim 1, further comprising:
configurable core-to-core dataflow between adjacent compute cores in respective ones of the plurality of processing regions;
configurable memory-to-core dataflow from respective ones of the plurality of regions of the first memory to one or more cores within adjacent ones of the plurality of processing regions;

configurable core-to-memory dataflow from one or more cores within ones of the plurality of processing regions to adjacent ones of the plurality of regions of the first memory; and configurable memory-to-core dataflow from the second memory region to one or more cores of corresponding ones of the plurality of processing regions.

13. The MPU of claim 12, wherein given configured core-to-core dataflow comprises partial-sum passing.

14. The MPU of claim 12, wherein a given configured core-to-core dataflow comprises feature map data sharing.

15. The MPU of claim 12, wherein a given configured core-to-core dataflow comprises weight data sharing.

16. The memory processing unit of claim 1, wherein respective ones of a plurality of regions of the second memory are associated with respective ones of the plurality of processing regions.

17. The memory processing unit of claim 16, wherein respective ones of the plurality of regions of the second memory are configurably couplable to one or more of the compute cores in respective ones of the plurality of processing regions.

18. The memory processing unit of claim 16, wherein the plurality of regions of the second memory include a plurality of blocks organized in one or more macros.

19. The memory processing unit of claim 16, wherein physical channels of compute cores are associated with respective slots of the memory macros.

20. A memory processing unit (MPU) comprising:
a first memory including a plurality of regions;
a plurality of processing regions interleaved between the plurality of regions of the first memory, wherein the processing regions include a plurality of compute cores;
a second memory coupled to the plurality of processing regions; and
control logic to:
configure data flow between compute cores of one or more of the processing regions and corresponding adjacent regions of the first memory;
configure data flow between the second memory and the compute cores of one or more of the processing regions; and
configure data flow between compute cores within one or more respective ones of the processing regions.

* * * * *